(12) United States Patent  
Kurokawa et al.

(10) Patent No.: US 8,664,581 B2  
(45) Date of Patent: Mar. 4, 2014

(54) INPUT/OUTPUT DEVICE AND DRIVING METHOD THEREOF

(75) Inventors: Yoshiyuki Kurokawa, Kanagawa (JP); Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 203 days.

(21) Appl. No.: 13/293,156

(22) Filed: Nov. 10, 2011

(65) Prior Publication Data

US 2012/0119073 A1    May 17, 2012

(30) Foreign Application Priority Data

Nov. 12, 2010  (JP) ................................ 2010-253618

(51) Int. Cl.
*H01L 27/00* (2006.01)
(52) U.S. Cl.
USPC ................... 250/214.1; 250/208.1; 250/221; 345/207
(58) Field of Classification Search
USPC .......... 250/208.1, 214.1, 206.1, 221; 345/76, 345/77, 175, 207
See application file for complete search history.

(56) References Cited

U.S. PATENT DOCUMENTS

| | | | |
|---|---|---|---|
| 2010/0097352 A1* | 4/2010 | Ahn et al. ...................... | 345/175 |
| 2011/0043502 A1* | 2/2011 | Yamashita et al. ............ | 345/207 |
| 2011/0204371 A1 | 8/2011 | Kozuma et al. | |
| 2011/0220889 A1 | 9/2011 | Kurokawa et al. | |
| 2011/0221724 A1 | 9/2011 | Kurokawa et al. | |
| 2011/0221945 A1 | 9/2011 | Kurokawa et al. | |

FOREIGN PATENT DOCUMENTS

JP       2010-019915 A    1/2010

\* cited by examiner

*Primary Examiner* — Kevin Pyo
(74) *Attorney, Agent, or Firm* — Fish & Richardson P.C.

(57) ABSTRACT

An input/output device includes a pixel area; a light emission circuit provided in the pixel area and configured to emit light; and a photodetection circuit provided in the pixel area and configured to generate a voltage having a value corresponding to an intensity of incident light. The light emission circuit includes a drive transistor and a light emitting element. The light emitting element includes a first current terminal electrically connected to the source or the drain of the drive transistor and a second current terminal to which a first voltage is input, and emits light in accordance with a current flowing between the first and second current terminals. The light emission circuit includes a switching element including a first terminal to which a second voltage is input, and a second terminal electrically connected to the first current terminal of the light emitting element.

5 Claims, 7 Drawing Sheets

INPUT/OUTPUT DEVICE AND DRIVING METHOD THEREOF

BACKGROUND OF THE INVENTION

1. Field of the Invention

An embodiment of the present invention relates to an input/output device and a driving method thereof.

2. Description of the Related Art

In recent years, technological development of a device having a function of outputting data and inputting data by using incident light (such a device is also called an input/output device) has been promoted.

An example of the input/output device is an input/output device that includes a plurality of light emission circuits which serve as display circuits and a plurality of photodetection circuits (also called photosensors) arranged in the row and column directions and provided in a pixel area, and that has a function of detecting the coordinates of an object to be detected over the pixel area (also called a coordinate-detecting function) by detecting the intensity of light entering the photosensors and a function of generating the image data of the object (also called a read function) (see Patent Document 1, for example). With the coordinate-detecting function, the input/output device can also serve as a touch panel, for example. Further, with the read function, the input/output device can also serve as a scanner and can display an image based on image data generated with the read function on the pixel area by using the plurality of light-emission circuits.

REFERENCE

Patent Document

[Patent Document 1] Japanese Published Patent Application No. 2010-019915

SUMMARY OF THE INVENTION

A conventional input/output device like that shown in Patent Document 1 has a problem of the insufficient quality of a displayed image.

For example, in the above-described conventional input/output device, display data in the plurality of light emission circuits are refreshed to maximize the luminance of the plurality of light emission circuits and the read operation is performed by the photodetection circuits. Consequently, every time display data in the plurality of light emission circuits are refreshed to maximize the luminance of the plurality of light emission circuits, the displayed image is changed temporarily and this change of the displayed image causes the displayed image to flicker, which reduces the quality of the displayed image.

An object of one embodiment of the present invention is to improve the quality of a displayed image.

One embodiment of the present invention includes a pixel area, a plurality of light emission circuits provided in the pixel area, a photodetection circuit provided in the pixel area and configured to generate optical data that is a voltage having a value corresponding to the intensity of incident light.

The light emission circuit includes at least a light emitting element and a switching element serving as a luminance switch selection switch.

The light emitting element includes at least two terminals. Current flows between the two terminals in accordance with the voltage applied between the two terminals. The light emitting element emits light in accordance with the current flowing between the two terminals.

The switching element switches the voltage applied between the two terminals of the light emitting element. For example, the voltage applied between the two terminals of the light emitting element can be switched by switching the on state and the off state of the switching element.

The above-described structure facilitates switching of the luminance of the light emitting element and increases the switching speed of the displayed image.

In one embodiment of the present invention, the input/output device with the above-described structure generates optical data when the luminance switch selection switch is in the on state.

In one embodiment of the present invention, first optical data is generated when the luminance switch selection switch is in the on state, second optical data is generated when the luminance switch selection switch is in the off state, and the data of a difference between the first optical data and the second optical data is generated.

The above-described structure reduces the adverse effect of light around the input/output device on the generated optical data.

One embodiment of the present invention increases the switching speed of the displayed image and reduces flicker in the displayed image, thereby reducing the decrease in the quality of the displayed image, so that the quality of the displayed image can be improved.

DETAILED DESCRIPTION OF THE INVENTION

Examples of embodiments of the present invention will be described below with reference to the drawings. Note that it is easy for those skilled in the art to change contents in an embodiment without departing from the spirit and the scope of the present invention. The present invention is therefore not limited to the following description of the embodiments.

Note that the contents of the embodiments can be combined with each other as appropriate. In addition, the contents of the embodiments can be replaced with each other.

Further, the ordinal numbers such as "first" and "second" are used to avoid confusion between components and do not limit the number of each component.

Embodiment 1

In this embodiment, an example of an input/output device that can output data by displaying an image and can input data by using incident light is described.

An example of the input/output device in this embodiment will be described with reference to FIGS. 1A and 1B.

First, the structural example of the input/output device of this embodiment will be described with reference to FIG. 1A. FIG. 1A is a schematic diagram illustrating the structural example of the input/output device in this embodiment.

Figure 1A:
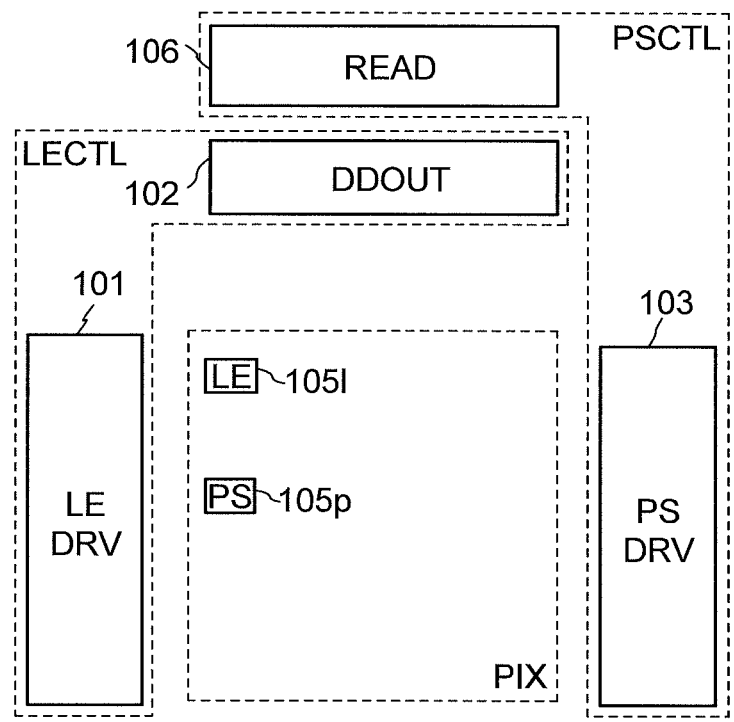
FIGS. 1A to 1C are diagrams illustrating an example of an input/output device of Embodiment 1.

The input/output device in FIG. 1A includes a light emission controller LECTL, a photodetection controller PSCTL, and a pixel area PIX.

The light emission controller LECTL is a part controlling light emitting operation in the input/output device.

The photodetection controller PSCTL is a part controlling photodetection operation in the input/output device.

The pixel area PIX is a part inputting and outputting data by performing the light emitting operation and the photodetection operation to display an image and detect incident light.

Note that the light emission controller LECTL and the photodetection controller PSCTL are not necessarily included in the input/output device.

Further, the input/output device in FIG. 1A includes a light emission driver circuit (LEDRV) 101, a display data signal output circuit (DDOUT) 102, a photodetection driver circuit (PSDRV) 103, a plurality of light emission circuits (LE) 1051, a photodetection circuit (PS) 105$p$, and a read circuit (READ) 106.

The light emission driver circuit 101 is provided in the light emission controller LECTL. The light emission driver circuit 101 controls the light emitting operation of the light emission circuits 1051.

The light emission driver circuit 101 has a shift register, for example. In this case, the light emission driver circuit 101 can output a plurality of pulse signals from the shift register, and thus can output a signal for controlling the light emission circuits 1051. Alternatively, the light emission driver circuit 101 may have a plurality of shift registers. In this case, the light emission driver circuit 101 can output a plurality of pulse signals from the plurality of shift registers, respectively, and thus output a plurality of signals for controlling the light emission circuits 1051.

The display data signal output circuit 102 is provided in the light emission controller LECTL. An image signal is input to the display data signal output circuit 102. The display data signal output circuit 102 has a function of generating a display data signal that is a voltage signal on the basis of the input image signal and outputting the generated display data signal.

The display data signal output circuit 102 has a plurality of transistors, for example.

Note that in the input/output device, the transistor has two terminals and a current control terminal for controlling current caused by applied voltage to flow between the two terminals. Note that, not only in the transistor but in any device, terminals between which current is controlled are also called current terminals. These two current terminals are also called a first current terminal and a second current terminal, respectively.

In the input/output device, a field-effect transistor, for example, can be used as the transistor. In a field-effect transistor, a first current terminal, a second current terminal, and a current control terminal are one of a source and a drain, the other of the source and the drain, and a gate, respectively.

The term "voltage" generally means a difference between potentials at two points (a potential difference). However, voltage and potential may be both represented by volts (V) in a circuit diagram or the like; thus, it is difficult to distinguish them. For this reason, in this specification, a potential difference between a potential at one point and a potential to be a reference (a reference potential) is used as voltage at the point in some cases unless otherwise specified.

The display data signal, output circuit 102 can output the data of an input signal as a display data signal when the transistor is in the on state. The transistor can be controlled by inputting a control signal that is a pulse signal to the current control terminal. Note that in the case where the number of the light emission circuits 1051 is more than one, a plurality of switching transistors may be selectively switched to the on state or the off state so that the data of image signals is output as a plurality of display data signals.

The photodetection driver circuit 103 is provided in the photodetection controller PSCTL. The photodetection driver circuit 103 is used to control the photodetection operation of the photodetection circuit 105$p$.

The photodetection driver circuit 103 outputs at least a photodetection reset signal and an output selection signal which are pulse signals.

The photodetection driver circuit 103 has, for example, at least two shift registers. In this case, the photodetection driver circuit 103 can output a pulse signal from one of the two shift registers and thus output a photodetection reset signal, and can output a pulse signal from the other of the two shift registers and thus output an output selection signal.

The plurality of light emission circuits (LE) 1051 is provided in the pixel area PIX in the row and column directions. A display data signal is input to each of the plurality of light emission circuits 1051. The plurality of light emission circuits 1051 has a display function and can serve as display circuits.

Note that it is also possible to display a full-color image in the pixel area by providing a light emission circuit emitting red light, a light emission circuit emitting green light, and a light emission circuit emitting blue light and by making these light emission circuits emit light. In addition to the above-described light emission circuits, one or more light emission circuits emitting light of one or more of the following colors: cyan, magenta, and yellow may be provided. By providing the light emission circuit emitting light of one or more of the following colors: cyan, magenta, and yellow, the kind of colors that can be represented in a displayed image can be increased, so that the quality of the displayed image can be improved. For example, a light emitting element and a coloring layer that transmits light of a particular color emitted from the light emitting element are provided to a light emission circuit and light is emitted from the light emitting element so as to pass the coloring layer, thereby achieving the emission of light of the particular color. This structure enables a full-color image to be displayed without forming a plurality of light emitting elements emitting light of different colors, thereby facilitating the manufacturing process, enhancing yield, and improving the quality and reliability of the light emitting elements.

Now, an example of the configuration of the light emission circuit 1051 will be described with reference to FIG. 1B.

Figure 1B:
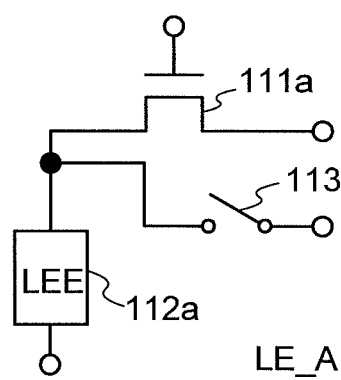

A light emission circuit LE_A in FIG. 1B includes at least a transistor 111$a$, a light emitting element (LEE) 112$a$, and a switching element 113.

In the input/output device, the light emitting element includes a first current terminal, a second current terminal, and an electroluminescent layer overlapping with the first and second current terminals. The light emitting element emits light when current flows between the first and second current terminals in accordance with a voltage applied between the first and second current terminals.

The transistor 111$a$ has a function of controlling the value of a current to be supplied to the light emitting element in accordance with a display data signal input, and can serve as a drive transistor having this function.

The first current terminal of the light emitting element 112a is electrically connected to the source or the drain of the transistor 111a. The voltage Va is applied to the second current terminal of the light emitting element 112a.

The switching element 113 includes a first terminal and a second terminal. The Voltage Vb is applied to the first terminal of the switching element 113. The second terminal of the switching element 113 is electrically connected to the first current terminal of the light emitting element 112a.

Note that one of the voltage Va and the voltage Vb is high supply voltage Vdd, and the other is low supply voltage Vss. The absolute value of a difference between the values of the voltage Va and the voltage Vb is preferably larger than at least the absolute value of the threshold voltage of the drive transistor. The values of the voltage Va and the voltage Vb may interchange depending, for example, on the conductivity type of the transistor.

In addition to the light emission circuit LE_A including the drive transistor, the light emitting element, and the switching element serving as a luminance switch selection switch, a light emission circuit LE_B having a configuration different from that of the light emission circuit LE_A may be provided in the pixel area PIX. An example of the circuit configuration of the light emission circuit LE_B will be described with reference to FIG. 1C.

Figure 1C:
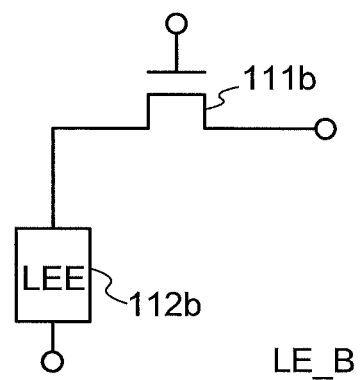

The light emission circuit LE_B in FIG. 1C includes a transistor 111b and a light emitting element 112b and does not include the switching element 113 shown in FIG. 1B.

The transistor 111b serves as a drive transistor.

The first current terminal of the light emitting element 112b is electrically connected to the source or the drain of the transistor 111b. The voltage Va is applied to the second current terminal of the light emitting element 112b.

The components of the light emission circuits in FIGS. 1B and 1C will be described.

Note that each of the transistors 111a and 111b can be, for example, a transistor having a semiconductor layer containing a semiconductor that belongs to Group 14 in the periodic table (e.g., silicon) or an oxide semiconductor layer in which a channel is formed. The oxide semiconductor layer has a wider bandgap than silicon and is an intrinsic (i-type) or substantially intrinsic semiconductor layer in which the number of carriers is extremely small and the carrier concentration is lower than $1 \times 10^{14}/cm^3$, preferably lower than $1 \times 10^{12}/cm^3$, more preferably lower than $1 \times 10^{11}/cm^3$.

The off-state current per micrometer of channel width of the transistor having an oxide semiconductor layer is lower than or equal to 10 aA ($1 \times 10^{-17}$ A), preferably lower than or equal to 1 aA ($1 \times 10^{-18}$ A), more preferably lower than or equal to 10 zA ($1 \times 10^{-20}$ A), more preferably lower than or equal to 1 zA ($1 \times 10^{-21}$ A), more preferably lower than or equal to 100 yA ($1 \times 10^{-22}$ A).

Since the oxide semiconductor layer has low carrier concentration, the off-state current of the transistor having an oxide semiconductor layer is low even when temperature changes. For example, even when the temperature of the transistor is 150° C., the off-state current per micrometer of channel width of the transistor can be 100 zA.

An oxide semiconductor layer containing crystals aligned perpendicularly to a surface of the layer (crystals with c-axis alignment), for example, can be used as the oxide semiconductor layer. For example, an oxide semiconductor layer is formed with a substrate temperature of 100 to 500° C. and then subjected to heat treatment, so that an oxide semiconductor layer containing crystals aligned perpendicularly to a surface of the layer can be formed. Alternatively, the oxide semiconductor layer may be a stack of a plurality of oxide semiconductor layers. The use of the oxide semiconductor layer containing crystals aligned perpendicularly to a surface of the layer can, for example, reduce changes in the electrical characteristics of a transistor due to light.

For example, the use of a transistor having the above-stated oxide semiconductor layer can reduce fluctuations in the gate voltages of the transistors 111a and 111b due to the leakage current.

Each of the transistors 111a and 111b has a function of setting the luminance of the light emitting element 112a or 112b to a value corresponding to a display data signal input, and can serve as a drive transistor.

An electroluminescent (EL) element, a light-emitting diode, a light-emitting transistor, or the like can be used as each of the light emitting elements 112a and 112b. In the case of using a light-emitting diode, one of the anode and cathode of the light-emitting diode corresponds to the first current terminal of the light emitting element, and the other corresponds to the second current terminal of the light emitting element.

The switching element 113 can be, for example, a field-effect transistor, e.g., a transistor having a semiconductor layer containing a semiconductor belonging to Group 14 in the periodic table (e.g., silicon) or an oxide semiconductor layer, in which a channel is formed. In the case where a field-effect transistor is used, one of the source and the drain of the field-effect transistor corresponds to the first terminal, and the other corresponds to the second terminal A pulse signal is input to the gate of the field-effect transistor. Further, the switching element 113 can be a switching element using a micro electro mechanical system (MEMS) or the like.

The switching element 113 has a function of switching the voltage of the first current terminal of the light emitting element 112a to the voltage Vb and switching the luminance of the light emitting element 112a, and can serve as a luminance switch selection switch having this function.

Note that the above-described light emission circuit may be provided with a signal-input-selection transistor and a storage capacitor.

A signal-input-selection signal, which is a pulse signal, is input to the current control terminal of the signal-input-selection transistor. At this time, a display data signal is input to the light emission circuit in response to the signal-input-selection signal through the source and the drain of the signal-input-selection transistor. The input of the signal-input-selection signal is achieved by, for example, outputting a pulse signal from the shift register in the light emission driver circuit 101.

The storage capacitor has a function of holding the voltage of the gate of the drive transistor for a certain period of time.

This is an example of the configuration of the light emission circuit.

The photodetection circuit 105p shown in FIG. 1A is provided in the pixel area PIX. The photodetection circuit 105p generates voltage corresponding to the intensity of incident light. Note that a plurality of photodetection circuits 105p may be provided in the pixel area PIX.

The photodetection circuit 105p generates optical data that is a voltage having a value corresponding to the intensity of incident light.

For example, a photodetection reset signal (a signal PRST) and an output selection signal (a signal OSEL), which are pulse signals, are input to the photodetection circuit 105p. The photodetection circuit 105p has at least, for example, a photoelectric transducer and an amplifier transistor.

The photoelectric transducer includes a first current terminal and a second current terminal. When light enters the photoelectric transducer, a current (a photocurrent) corresponding to the intensity of the light flows between the first and second current terminals.

A photodiode or a phototransistor, for example, can be used as the photoelectric transducer. When the photoelectric transducer is a photodiode, one of the anode and the cathode of the photodiode corresponds to the first current terminal of the photoelectric transducer, and the other of the anode and the cathode of the photodiode corresponds to the second current terminal of the photoelectric transducer. When the photoelectric transducer is a phototransistor, one of the source and the drain of the phototransistor corresponds to the first current terminal of the photoelectric transducer, and the other of the source and the drain of the phototransistor corresponds to the second current terminal of the photoelectric transducer.

In the amplifier transistor, the voltage of the current control terminal is set in accordance with photocurrent generated by the photoelectric transducer and the channel resistance of the drive transistor changes in accordance with the voltage of the current control terminal, so that current flows between the first and second current terminals of the drive transistor.

The photodetection circuit 105p with the above-described configuration goes into the reset state in response to the photodetection reset signal, and then, the voltage of the current control terminal of the amplifier transistor is set in accordance with photocurrent generated by the photoelectric transducer. Further, in the photodetection circuit 105p with the above-described configuration, the channel resistance of the amplifier transistor changes in accordance with the voltage of the current control terminal, and the photodetection circuit 105p generates voltage to be optical data and outputs optical data in response to the output selection signal.

Note that it is also possible to generate the data of a full-color image signal by providing a photodetection circuit receiving red light, a photodetection circuit receiving green light, and a photodetection circuit receiving blue light, generating optical data by these photodetection circuits, and combining the generated optical data of different colors. In addition to the above-described photodetection circuits, one or more photodetection circuits receiving light of the following colors: cyan, magenta, and yellow may be provided. By providing one or more photodetection circuits receiving light of one or more the following colors: cyan, magenta, and yellow, the kind of colors that can be represented in a displayed image based on generated image signals can be increased. For example, by providing a coloring layer, which transmits light of a particular color, in a photodetection circuit and letting light in the photodetection circuit through the coloring layer, optical data that is a voltage having a value corresponding to the intensity of light of a particular color can be generated.

A photodetection circuit receiving only light in the infrared region may be provided in the case where the input/output device includes, in the pixel area PIX, the light emission circuit including the drive transistor, the light emitting element, and the luminance switch selection switch, and the light emission circuit including the drive transistor and the light emitting element. Providing the photodetection circuit receiving only light in the infrared region can improve photodetection accuracy.

Note that one or more light emission circuits 1051 form one pixel. Alternatively, a pixel may be formed by one or more light emission circuits 1051 and one or more photodetection circuits 105p.

The read circuit 106 has a function of reading optical data from the photodetection circuit 105p.

The read circuit 106 includes a selection circuit, for example. For example, the selection circuit includes a transistor and can read optical data when optical data is input from the photodetection circuit 105p to the selection circuit as an optical data signal in accordance with the transistor.

Next, as an example of a method for driving the input/output device in this embodiment, an example of a method for driving the input/output device illustrated in FIG. 1A will be described. Here, as an example, the case where at least one of the plurality of light emission circuits 1051 is the light emission circuit LE_A with the structure illustrated in FIG. 1B will be described.

In the input/output device illustrated in FIG. 1A, the light emission circuits 1051 are selected row by row by the light emission driver circuit 101, and display data signals are input sequentially to the light emission circuits 1051 in each of the selected rows.

In the light emission circuit LE_A with the structure illustrated in FIG. 1B to which a display data signal has been input, the voltage of the gate of the transistor 111a is set to a value corresponding to the voltage of the display data signal input. At this time, current flows between the source and the drain of the transistor 111a in accordance with the voltage of the gate of the transistor 111a, and current flows between the first and second current terminals of the light emitting element 112a, so that the light emitting element 112a emits light.

Note that the voltage of the first current terminal of the light emitting element 112a is determined by a current flowing between the source and the drain of the transistor 111a, and thus can be regarded as having a value corresponding to the voltage of the gate of the transistor 111a, i.e., the voltage of the display data signal. In addition, a current flowing between the first and second current terminals of the light emitting element 112a can be set in accordance with the value of a current flowing between the source and the drain of the transistor 111a. The luminance of the light emitting element 112a changes in accordance with the value of a current flowing between the first and second current terminals.

The value of a current flowing between the source and the drain of the drive transistor (the transistor 111a), which is also called a current Ids, increases with an increase in the absolute value of a difference between a voltage applied between the gate and the source of the drive transistor (also called a voltage Vgs) and the threshold voltage (also called the voltage Vthd) of the drive transistor.

When the absolute value of a difference between voltage Vgs and voltage Vthd is greater than the absolute value of a voltage applied between the source and the drain of the drive transistor (also called a voltage Vds), the drive transistor operates in the linear region. When the absolute value of a difference between voltage Vgs and voltage Vthd is less than or equal to the absolute value of voltage Vds, the drive transistor operates in the saturation region. For example, when the drive transistor operates in the saturation region, the current Ids hardly changes even when the voltage Vds changes, so that the value of the current Ids can be set by changing the value of the voltage Vgs.

In the light emission circuit, a current flowing between the source and the drain of the drive transistor is set by, for example, the voltage of the gate of the drive transistor, and the value of a current flowing between the first and second current terminals of the light emitting element is set to set the luminance of the light emitting element, so that the gradation of a displayed image can be expressed. Therefore, by setting the luminance of the light emitting element in every light emission circuit, an image can be displayed on the pixel area.

In the input/output device illustrated in FIG. 1A, the switching element 113 in the light emission circuit LE_A is selectively switched to the on state. The timing of switching the switching element 113 to the on state is set as appropriate.

When the switching element 113 is in the on state, the voltage of the first current terminal of the light emitting element 112a changes to a value same as that of the voltage Vb. Therefore, the value of a current flowing between the first and second current terminals of the light emitting element 112a changes to a value corresponding to the absolute value of a difference between the voltage Va and the voltage Vb, and the luminance of the light emitting element 112a changes to a value corresponding to the absolute value of a difference between the voltage Va and the voltage Vb. Note that the luminance of the light emitting element (the light emitting element 112a) during when the switching element 113 is in the on state is preferably the maximum luminance of the light emitting element.

When the switching element 113 is in the off state, for example, the value of a current flowing between the first and second current terminals of the light emitting element 112a becomes a value corresponding to the value of a current flowing between the source and the drain of the transistor 111a, and the luminance of the light emitting element 112a becomes a value corresponding to the value of a current flowing between the first and second current terminals.

In the input/output device illustrated in FIG. 1A, optical data that is a voltage corresponding to the intensity of incident light is generated in the photodetection circuit 105p, and the input/output device outputs the optical data as an optical data signal. Note that operation for generating optical data performed by the photodetection circuit 105p is performed at least when the luminance switch selection switch (the switching element 113) in the light emission circuit (the light emission circuit LE_A) is in the on state. In addition, also when the luminance switch selection switch (the switching element 113) is in the off state, optical data may be generated by the photodetection circuit 105p.

For example, when an object to be detected is over the pixel area PIX, light emitted from the light emission circuit 105l is reflected by the object to be detected, and the reflected light enters the photodetection circuit 105p, so that optical data that is a voltage corresponding to the intensity of incident light is generated in the photodetection circuit 105p and the optical data is output as an optical data signal.

Further, optical data output from the photodetection circuit 105p is read by the read circuit 106. The read optical data is used for a predetermined process such as the detection of the coordinates of an object to be detected or generation of image data.

An example of a method for driving the input/output device including, in the pixel area, the light emission circuit LE_B including the drive transistor and the light emitting element as in FIG. 1C, in addition to the light emission circuit LE_A including the drive transistor, the light emitting element, and the luminance switch selection switch will be described below.

In an example of a method for driving the input/output device including the light emission circuit LE_A and the light emission circuit LE_B, the plurality of light emission circuits 105l is selected row by row by the light emission driver circuit 101 and display data signals are input sequentially to the selected light emission circuits 105l.

In each of the light emission circuits LE_A and LE_B to which a display data signal has been input, the voltage of the gate of the drive transistor (the transistor 111a or 111b) is set to a value corresponding to the voltage of the display data signal input. At this time, current flows between the source and the drain of the drive transistor (the transistor 111a or 111b) in accordance with the voltage of the gate of the drive transistor (the transistor 111a or 111b) and current flows between the first and second current terminals of the light emitting element (the light emitting element 112a or 112b), so that the light emitting element (the light emitting element 112a or 112b) emits light.

In the input/output device illustrated in FIG. 1A, the switching element 113 in the light emission circuit LE_A is selectively switched to the on state. The timing of switching the switching element 113 to the on state is set as appropriate.

Here, in the light emission circuit LE_A, the voltage of the first current terminal of the light emitting element 112a changes to a value same as that of the voltage Vb. Therefore, the value of a current flowing between the first and second current terminals of the light emitting element 112a changes to a value corresponding to the absolute value of a difference between the voltage Va and the voltage Vb, and the luminance of the light emitting element 112a changes to a value corresponding to the absolute value of a difference between the voltage Va and the voltage Vb. Note that the luminance of the light emitting element (the light emitting element 112a) during when the switching element 113 is in the on state is preferably the maximum luminance of the light emitting element.

At this time, in the light emission circuit LE_B, the voltage of the gate of the transistor 111b is maintained at a value corresponding to the voltage of the display data signal input. Consequently, the light emission circuit LE_B keeps emitting light in accordance with the voltage of the display data signal.

Further, in the light emission circuit LE_A, when the switching element 113 is in the off state, for example, the value of a current flowing between the first and second current terminals of the light emitting element 112a becomes a value corresponding to the value of a current flowing between the source and the drain of the transistor 111a, and the luminance of the light emitting element 112a becomes a value corresponding to the value of a current flowing between the first and second current terminal.

At this time, in the light emission circuit LE_B, the voltage of the gate of the transistor 111b is maintained at a value corresponding to the voltage of the display data signal input. Consequently, the light emission circuit LE_B keeps emitting light in accordance with the voltage of the display data signal input.

As described above, the light emission circuit LE_B enables an image corresponding to a display data signal to be displayed on the pixel area even while the luminance is changed in the light emission circuit LE_A, so that a decrease in the quality of a displayed image can be avoided.

In addition, in the case of the light emission circuit LE_A, first optical data is generated by the photodetection circuit 105p when the luminance switch selection switch (the switching element 113) is in the on state, and second optical data is generated by the photodetection circuit 105p when the luminance switch selection switch (the switching element 113) is in the off state; thus, the data of a difference between the first optical data and the second optical data. For example, the data of a difference between the first optical data and the second optical data can be generated by using an image processing circuit. The image processing circuit is not necessarily provided in the input/output device. By generating the data of a difference between the first optical data and the second optical data, the adverse effect of light around the input/output device can be reduced.

As described with reference to FIGS. 1A to 1C, an example of the input/output device in this embodiment includes the plurality of light emission circuits and the photodetection circuit in the pixel area. At least one of the plurality of light emission circuits includes the drive transistor, the light emitting element, and the luminance switch selection switch. In an example of the input/output device in this embodiment, a display data signal is input to each of the plurality of light emission circuits, the voltage of the gate of the drive transistor in each of the light emission circuits is set to a value corresponding to the voltage of the display data signal input, the luminance of the light emitting element is switched by the luminance switch selection switch in the light emission circuit provided with the luminance switch selection switch, and the photodetection circuit generates optical data at least when the luminance switch selection switch is in the on state. In an example of the input/output device in this embodiment, when an object to be detected is over the pixel area, light emitted from at least one of the plurality of light emission circuits is reflected by the object to be detected, and the light reflected by the object to be detected enters the photodetection circuit.

With the above-described structure, a display data signal can be input to the light emission circuit and the voltage of the gate of the drive transistor in each of the light emission circuits can be set to a value corresponding to the voltage of the display data signal input. The luminance of the light emitting element can be switched by switching the luminance switch selection switch to the on or off state, so that the time for switching the luminance of the light emitting element can be reduced. This increases the switching speed of the displayed image, thereby reducing flicker in a displayed image, so that the decrease in the quality of the displayed image can be reduced, which can improve the quality of the displayed image.

Alternatively, an example of the input/output device in this embodiment may include, in the pixel area, the first light emission circuit including the drive transistor, the light emitting element, and the luminance switch selection switch; and the second light emission circuit including the drive transistor and the light emitting element.

With the above-described structure, the second light emission circuit can emit light in accordance with the voltage of a display data signal input while the luminance of the light emitting element in the first light emission circuit is switched, so that flicker in a displayed image can be reduced and the decrease in the quality of the displayed image can be reduced.

As described above, the decrease in the quality of a displayed image is reduced, so that the quality of the displayed image can be increased.

Embodiment 2

In this embodiment, examples of the light emission circuit in one example of the input/output device of Embodiment 1 are described.

Examples of the light emission circuit in this embodiment will be described with reference to FIGS. 2A to 2D.

Figure 2A:
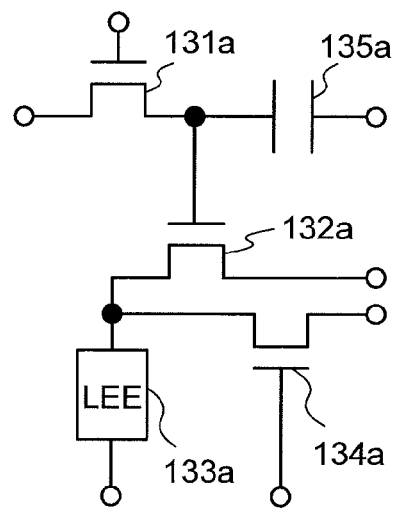
FIGS. 2A to 2D are diagrams illustrating examples of the configuration of the light emission circuit in Embodiment 2.
Figure 2B:
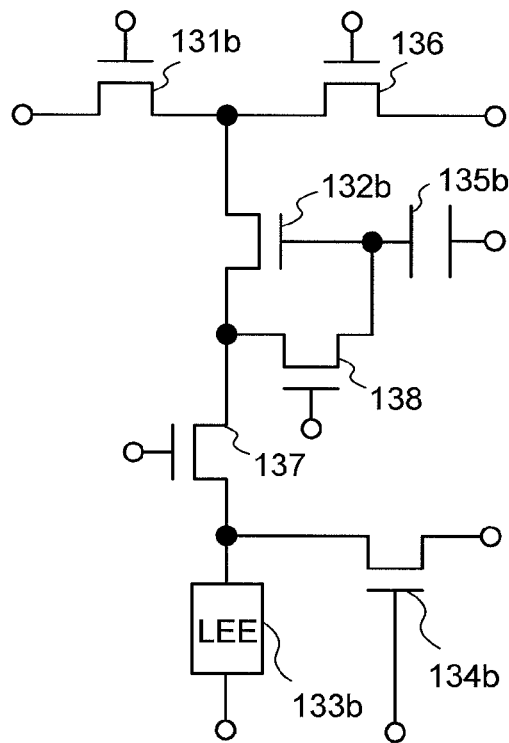

First, examples of the configuration of the light emission circuit in this embodiment will be described with reference to FIGS. 2A and 2B. FIGS. 2A and 2B illustrate examples of the configuration of the light emission circuit in this embodiment.

The light emission circuit in FIG. 2A includes a transistor 131a, a transistor 132a, a light emitting element (also called an LEE) 133a, a transistor 134a, and a capacitor 135a.

In the light emission circuit in FIG. 2A, the transistors 131a, 132a, and 134a are field-effect transistors.

Note that, in the input/output device, a capacitor includes a first capacitor electrode, a second capacitor electrode, and a dielectric layer overlapping with the first capacitor electrode and the second capacitor electrode. The capacitor stores electric charge in accordance with voltage applied between the first capacitor electrode and the second capacitor electrode.

A display data signal (also called a signal DD) is input to one of the source and the drain of the transistor 131a. A signal-input-selection signal (also called a signal SSEL) is input to the gate of the transistor 131a.

The voltage Vb is input to one of the source and the drain of the transistor 132a. The gate of the transistor 132a is electrically connected to the other of the source and the drain of the transistor 131a.

The first current terminal of the light emitting element 133a is electrically connected to the other of the source and the drain of the transistor 132a. The voltage Va is input to the second current terminal of the light emitting element 133a.

The voltage Vb is input to one of the source and the drain of the transistor 134a. The other of the source and the drain of the transistor 134a is electrically connected to the first current terminal of the light emitting element 133a. A luminance switch selection signal (also called a signal LSW), which is a pulse signal, is input to the gate of the transistor 134a.

The voltage Vb is input to the first capacitor electrode of the capacitor 135a. The second capacitor electrode of the capacitor 135a is electrically connected to the gate of the transistor 132a.

The light emission circuit in FIG. 2B includes a transistor 131b, a transistor 132b, a light emitting element 133b, a transistor 134b, a capacitor 135b, a transistor 136, a transistor 137, and a transistor 138.

Note that, in the light emission circuit in FIG. 2B, the transistors 131b, 132b, 134b, 136, 137, and 138 are field-effect transistors.

A display data signal is input to one of the source and the drain of the transistor 131b. A signal-input-selection signal is input to the gate of the transistor 131b.

One of the source and the drain of the transistor 132b is electrically connected to the other of the source and the drain of the transistor 131b.

One of the source and the drain of the transistor 137 is electrically connected to the other of the source and the drain of the transistor 132b. A first continuity selection signal (also called a signal CSEL1), which is a pulse signal, is input to the gate of the transistor 137.

For example, a shift register for outputting the first continuity selection signal is provided in the light emission driver circuit 101 of Embodiment 1 and a plurality of pulse signals is output from the shift register, so that a plurality of first continuity selection signals is output and a different first continuity selection signal can be input to each low of light emission circuits.

The first current terminal of the light emitting element 133b is electrically connected to the other of the source and the drain of the transistor 134b. The voltage Va is input to the second current terminal of the light emitting element 133b.

The voltage Vb is input to one of the source and the drain of the transistor 134b. A luminance switch selection signal is input to the gate of the transistor 134b.

The voltage Vb is input to the first capacitor electrode of the capacitor 135b. The second capacitor electrode of the capacitor 135b is electrically connected to the gate of the transistor 132b.

The voltage Vb is input to one of the source and the drain of the transistor 136. The other of the source and the drain of the transistor 136 is electrically connected to the one of the source and the drain of the transistor 132b. A voltage input selection signal (also called a signal VSEL), which is a pulse signal, is input to the gate of the transistor 136.

For example, a shift register for outputting the voltage input selection signal is provided in the light emission driver circuit 101 of Embodiment 1 and a plurality of pulse signals is output from the shift register, so that a plurality of voltage input selection signals is output and a different voltage input selection signal can be input to each low of light emission circuits.

One of the source and the drain of the transistor 138 is electrically connected to the gate of the transistor 132a. The other of the source and the drain of the transistor 138 is electrically connected to the other of the source and the drain of the transistor 132b. A second continuity selection signal (also called a signal CSEL2), which is a pulse signal, is input to the gate of the transistor 138.

For example, a shift register for outputting the second continuity selection signal is provided in the light emission driver circuit 101 of Embodiment 1 and a plurality of pulse signals is output from the shift register, so that a plurality of second continuity selection signals is output and a different second continuity selection signal can be output to each low of light emission circuits.

The components of the light emission circuits in FIGS. 2A and 2B will be described.

The transistors 131a and 131b are display selection transistors.

The transistors 132a and 132b are drive transistors.

The transistors 134a and 134b are luminance switch selection switches. Note that a transistor serving as a luminance switch selection switch is also called a luminance switch selection transistor.

Note that, as shown in Embodiment 1, a light emission circuit that is the same as the light emission circuit in FIG. 2A except that it does not have the transistor 134a or a light emission circuit that is the same as the light emission circuit in FIG. 2B except that it does not have the transistor 134b may be provided in addition to the light emission circuit illustrated in FIG. 2A or 2B.

The capacitors 135a and 135b are storage capacitors.

The transistor 136 is a voltage input selection transistor having a function of selecting whether the voltage Vb is input to one of the source and the drain of the transistor 132b.

The transistor 137 is a continuity selection transistor having a function of selecting whether electrical continuity is established between the other of the source and the drain of the transistor 132b and the first current terminal of the light emitting element 133b. The transistor 137 is not necessarily provided, but providing the transistor 137 can reduce a current flowing from the other of the source and the drain of the transistor 132b to the first current terminal of the light emitting element 133b when display data is written.

The transistor 138 is a continuity selection transistor having a function of selecting whether electrical continuity is established between the gate and the other of the source and the drain of the transistor 132b.

The transistors 131a, 131b, 132a, 132b, 134a, 134b, 136, 137, and 138 each can be, for example, a transistor having a semiconductor layer containing a semiconductor belonging to Group 14 in the periodic table (e.g., silicon) or an oxide semiconductor layer, in which a channel is formed.

Next, an example of the method for driving the light emission circuits in FIGS. 2A and 2B will be described.

Figure 2C:
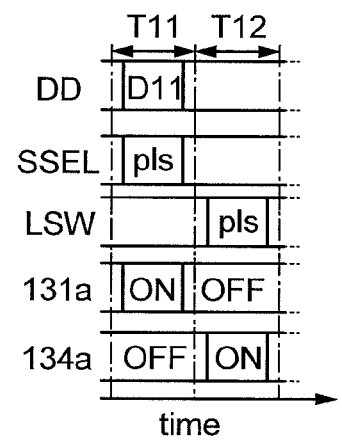

First, an example of the method for driving the light emission circuit in FIG. 2A will be described with reference to FIG. 2C. FIG. 2C is a timing diagram for describing the example of the method for driving the light emission circuit illustrated in FIG. 2A, and illustrates the states of a signal DD, a signal SSEL, a signal LSW, the transistor 131a, and the transistor 134a.

In the example of the method for driving the light emission circuit in FIG. 2A, in the period T11, there is an input of the pulse (also called pls) of the signal SSEL, so that the transistor 131a is in the on state (also called the state ON).

When the transistor 131a is in the on state, the signal DD is input to the light emission circuit, so that the values of the voltage of the gate of the transistor 132a and the voltage of the second capacitor electrode of the capacitor 135a each become the same as the value of the voltage of the signal DD (e.g., a voltage D11 here).

At this time, current flows between the source and the drain of the transistor 132a in accordance with the voltage of the gate of the transistor 132a, and current flows between the first and second current terminals of the light emitting element 133a, so that the light emitting element 133a emits light. At this time, the voltage of the first current terminal of the light emitting element 133a becomes a value corresponding to the value of the signal DD and the luminance of the light emitting element 133a becomes a value corresponding to the voltage Va and the voltage of the first current terminal set in accordance with the signal DD.

In addition, after the input of the pulse of the signal SSEL ends, the transistor 131a switches to the off state (also called the state OFF).

Then, the pulse of the signal LSW is input to switch the transistor 134a to the on state. In FIG. 2C, as an example, the transistor 134a is in the on state in the period T12 following the input of the pulse of the signal SSEL; however, one embodiment of the present invention is not limited to this; the transistor 134a may be in the on state in the period T11.

When the transistor 134a is in the on state, the voltage Vb is input to the first current terminal of the light emitting element 133a, so that the luminance of the light emitting element 133a changes to a value corresponding to the absolute value of a difference between the voltage Va and the voltage Vb.

In addition, after the input of the pulse of the signal LSW ends, the transistor 134a switches to the off state. At this time, the voltage of the first current terminal of the light emitting element 133a becomes a value corresponding to the voltage of the gate of the transistor 132a. This is the example of the method for driving the light emission circuit in FIG. 2A.

Figure 2D:
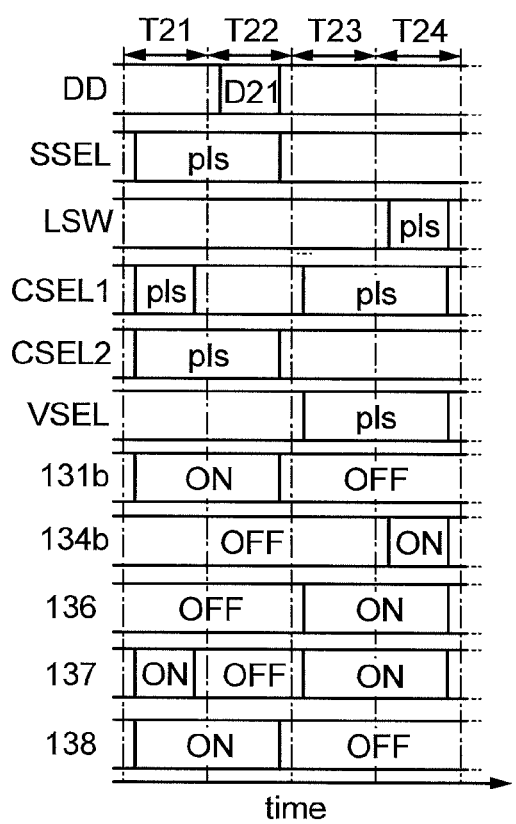

Next, an example of the method for driving the light emission circuit in FIG. 2B will be described with reference to FIG. 2D. FIG. 2D is a timing diagram for describing the example of the method for driving the light emission circuit in FIG. 2B and illustrates the sates of a signal DD, a signal SSEL, a signal LSW, a signal CSEL1, a signal CSEL2, a signal VSEL, the transistor 131b, the transistor 134b, the transistor 136, the transistor 137, and the transistor 138.

In the example of the method for driving the light emission circuit in FIG. 2B, in the period T21, there is an input of the pulse of the signal SSEL, so that the transistor 131b is in the on state and the transistor 136 is in the off state; there is an input of the pulse of the signal CSEL1, so that the transistor 137 is in the on state; and there is an input of the pulse of the signal CSEL2, so that the transistor 138 is in the on state.

At this time, the light emission circuit switches to the reset state and the voltage of the gate of the transistor 132b becomes a reference value.

In addition, after the input of the pulse of the signal CSEL1 ends, the transistor 137 switches to the off state.

Next, in the period T22, the transistor 131b is kept in the on state, the transistor 136 is kept in the off state, the transistor 137 is kept in the off state, and the transistor 138 is kept in the on state.

At this time, the signal DD is input to the light emission circuit, so that the values of the voltage of the gate of the transistor 132b and the voltage of the second capacitor electrode of the capacitor 135b each become a value obtained by subtracting the threshold voltage of the transistor 132b from the voltage of the signal DD (a voltage D21 here).

In addition, after the input of the pulse of the signal SSEL ends, the transistor 131b switches to the off state.

Next, in the period T23, the transistor 131b is in the off state; there is an input of the pulse of the signal VSEL, so that the transistor 136 is in the on state; there is an input of the pulse of the signal CSEL1, so that the transistor 137 is in the on state; and there is no input of the pulse of the signal CSEL2, so that the transistor 138 is in the off state.

At this time, current flows between the source and the drain of the transistor 132b in accordance with the voltage of the gate of the transistor 132b, and current flows between the first and second current terminals of the light emitting element 133b, so that the light emitting element 133b emits light. At this time, the voltage of the first current terminal of the light emitting element 133b becomes a value corresponding to the value of the signal DD and the luminance of the light emitting element 133b becomes a value corresponding to the voltage Va and the voltage of the first current terminal set in accordance with the signal DD.

Then, the pulse of the signal LSW is input to switch the transistor 134b to the on state. In FIG. 2D, as an example, the transistor 134b is in the on state in the period T24; however, one embodiment of the present invention is not limited to this; the transistor 134b may be in the on state in the period T23. In addition, in the period T24, the transistor 131b remains in the off state, the transistor 136 remains in the on state, the transistor 137 remains in the on state, and the transistor 138 remains in the off state.

When the transistor 134b is in the on state, the voltage Vb is input to the first current terminal of the light emitting element 133b, so that the luminance of the light emitting element 133b changes to a value corresponding to a difference between the voltage Va and the voltage Vb.

In addition, after the input of the pulse of the signal LSW ends, the transistor 134b switches to the off state. At this time, the voltage of the first current terminal of the light emitting element 133b becomes a value corresponding to the voltage of the gate of the transistor 132b. This is the example of the method for driving the light emission circuit in FIG. 2B.

As described with reference to FIGS. 2A to 2D, the example of the light emission circuit of this embodiment includes at least a signal-input-selection transistor, a storage capacitor, a drive transistor, a light emitting element, and a luminance switch selection switch.

With the above-described structure, a display data signal can be input to the light emission circuit in accordance with the signal input selection transistor and the voltage of the gate of the drive transistor in each of the light emission circuits can be set to a value corresponding to the voltage of the display data signal input; thus, the light-emitting element can emit light. The luminance of the light emitting element can be switched by switching the on state and the off state of the luminance switch selection switch, so that the time for switching the luminance can be reduced. Consequently, the switching time of the displayed image can be shortened, so that the decrease in the quality of the displayed image can be reduced.

Thus, the quality of the displayed image can be improved.

Embodiment 3

In this embodiment, examples of the photodetection circuit in the input/output device of the above embodiment are described.

Examples of the photodetection circuit in this embodiment will be described with reference to FIGS. 3A to 3F. FIGS. 3A to 3F illustrate the examples of the photodetection circuit of this embodiment.

Figure 3A:
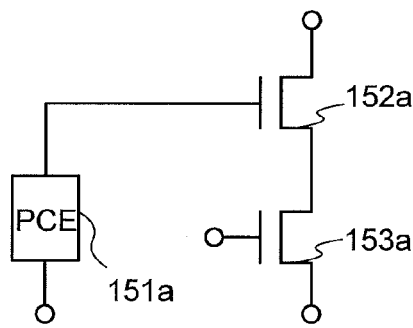
FIGS. 3A to 3F are diagrams illustrating examples of the configuration of the photodetection circuit in Embodiment 3.
Figure 3D:
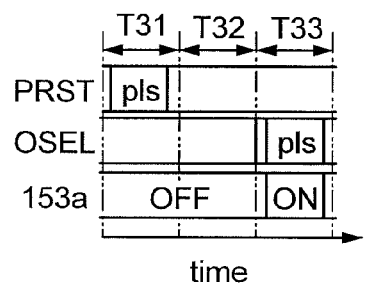
Figure 3B:
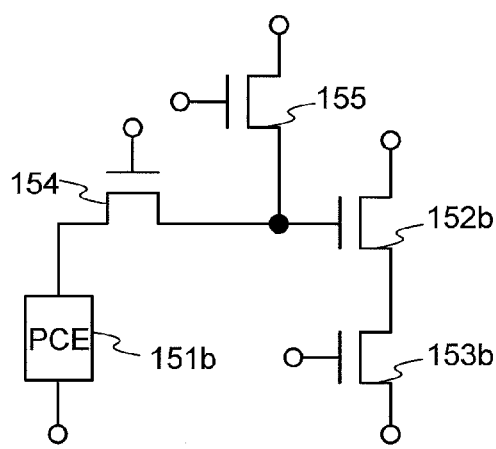
Figure 3E:
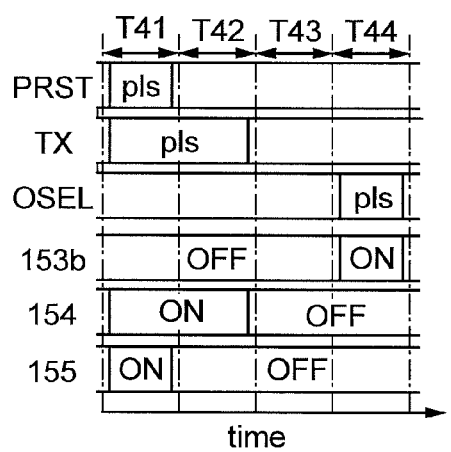
Figure 3C:
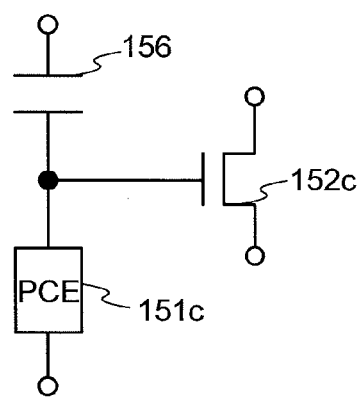

First, examples of the configuration of the photodetection circuit of this embodiment will be described with reference to FIGS. 3A to 3C. FIGS. 3A to 3C illustrate the examples of the configuration of the photodetection circuit of this embodiment.

The photodetection circuit illustrated in FIG. 3A includes a photoelectric transducer (PCE) 151a, a transistor 152a, and a transistor 153a.

Note that in the photodetection circuit illustrated in FIG. 3A, the transistor 152a and the transistor 153a are field-effect transistors.

A photodetection reset signal (also called a signal PRST) is input to the first current terminal of the photoelectric transducer 151a.

The gate of the transistor 152a is electrically connected to the second current terminal of the photoelectric transducer 151a.

One of the source and the drain of the transistor 153a is electrically connected to one of the source and the drain of the transistor 152a. An output selection signal (also called a signal OSEL) is input to the gate of the transistor 153a.

The voltage Va is applied to either the other of the source and the drain of the transistor 152a or the other of the source and the drain of the transistor 153a.

In addition, the photodetection circuit illustrated in FIG. 3A outputs optical data from the rest of the other of the source and the drain of the transistor 152a or the other of the source and the drain of the transistor 153a as an optical data signal.

The photodetection circuit illustrated in FIG. 3B includes a photoelectric transducer 151b, a transistor 152b, a transistor 153b, a transistor 154, and a transistor 155.

Note that in the photodetection circuit illustrated in FIG. 3B, the transistor 152b, the transistor 153b, the transistor 154, and the transistor 155 are field-effect transistors.

The voltage Vb is input to the first current terminal of the photoelectric transducer 151b.

One of the source and the drain of the transistor 154 is electrically connected to the second current terminal of the photoelectric transducer 151b. A charge storage control signal (also called a signal TX), which is a pulse signal, is input to the gate of the transistor 154.

The gate of the transistor 152b is electrically connected to the other of the source and the drain of the transistor 154.

The voltage Va is applied to one of the source and the drain of the transistor 155. The other of the source and the drain of the transistor 155 is electrically connected to the other of the source and the drain of the transistor 154. A signal PRST is input to the gate of the transistor 155.

One of the source and the drain of the transistor 153b is electrically connected to one of the source and the drain of the transistor 152b. A signal OSEL is input to the gate of the transistor 153b.

The voltage Va is applied to either the other of the source and the drain of the transistor 152b or the other of the source and the drain of the transistor 153b.

In addition, the photodetection circuit illustrated in FIG. 3B outputs optical data from the rest of the other of the source and the drain of the transistor 152b or the other of the source and the drain of the transistor 153b as an optical data signal.

Note that when the input/output unit includes a plurality of the photodetection circuits shown in FIG. 3B, the same charge storage control signal can be input to all the photodetection circuits. In this case, a driving method in which the same charge storage control signal is input to all the photodetection circuits to generate optical data is also called a global shutter method. Inputting the same charge storage control signal to all the photodetection circuits to generate optical data can shorten the period in which all the photodetection circuits generate optical data.

One embodiment of the present invention is not limited to the above-described structure; different charge storage control signals can be output to the plurality of photodetection circuits. For example, a shift register for outputting the charge storage control signal is provided in the photodetection driver circuit 103 of Embodiment 1 and a plurality of pulse signals is output from the shift register, so that a plurality of charge storage control signals is output and a different charge storage control signal can be output to each low of light emission circuits.

The photodetection circuit in FIG. 3C includes a photoelectric transducer 151c, a transistor 152c, and a capacitor 156.

A signal PRST is input to the first current terminal of the photoelectric transducer 151c.

The signal OSEL is input to the first capacity electrode of the capacitor 156. The second capacity electrode of the capacitor 156 is electrically connected to the second current terminal of the photoelectric transducer 151c.

The voltage Va is applied to one of the source and the drain of the transistor 152c. The gate of the transistor 152c is electrically connected to the second current terminal of the photoelectric transducer 151c.

Note that the photodetection circuit in FIG. 3C outputs optical data as an optical data signal from the other of the source and the drain of the transistor 152c.

The components of the photodetection circuits illustrated in FIGS. 3A to 3C will be described.

As the photoelectric transducers 151a to 151c, photodiodes, phototransistors, or the like can be used. In the case where the photoelectric transducers 151a to 151c are photodiodes, one of an anode and a cathode of the photodiode corresponds to the first current terminal of the photoelectric transducer, and the other of the anode and the cathode of the photodiode corresponds to the second current terminal of the photoelectric transducer. In the case where the photoelectric transducers 151a to 151c are phototransistors, one of the source and the drain of the phototransistor corresponds to the first current terminal of the photoelectric transducer, and the other of the source and the drain of the phototransistor corresponds to the second current terminal of the photoelectric transducer.

The transistors 152a to 152c are amplifier transistors.

The transistor 154 is a charge storage control transistor having a function of controlling whether the voltage of the gate of an amplifier transistor is set to a value corresponding to a photocurrent flowing through a photoelectric transducer. Although the transistor 154 is not necessarily provided in the photodetection circuit of this embodiment, providing the transistor 154 allows the voltage of the gate of the transistor 152b to be held for a certain period of time when the gate of the transistor 152b is in a floating state.

The transistor 155 is a photodetection reset transistor having a function of selecting whether the voltage of the gate of the amplifier transistor is set to a reference value.

The transistors 153a and 153b are output selection transistors having a function of selecting whether optical data is output.

Note that each of the transistors 152a, 152b, 152c, 153a, 153b, 154, and 155 is, for example, a transistor including a semiconductor layer containing a semiconductor that belongs to Group 14 in the periodic table (e.g., silicon) or a transistor including an oxide semiconductor layer. Channels are formed in the semiconductor layer and the oxide semiconductor layer of the transistors. For example, with the use of the transistor including the oxide semiconductor layer, fluctuation in gate voltage due to the leakage current of each of the transistors 152a, 152b, 152c, 153a, 153b, 154, and 155 can be reduced.

Transistors including the above-described oxide semiconductor layer may be used as one or more of the transistors 154 and 155. Transistors including a semiconductor layer containing a semiconductor that belongs to Group 14 in the periodic table (e.g., silicon) may be used as the transistors 152a, 152b, and 152c. Transistors including a semiconductor layer containing a semiconductor that belongs to Group 14 in the periodic table (e.g., silicon) or transistors including an oxide semiconductor layer may be used as the transistors 153a and 153b.

Next, examples of methods for driving the photodetection circuits illustrated in FIGS. 3A to 3C will be described.

First, the example of the method for driving the photodetection circuit illustrated in FIG. 3A will be described with reference to FIG. 3D. FIG. 3D is a timing diagram for describing the example of the method for driving the photodetection circuit illustrated in FIG. 3A and illustrates the states of a signal PRST, a signal OSEL, and the transistor 153a. Note that the case where the photoelectric transducer 151a is a photodiode is described as an example here.

In the example of the method for driving the photodetection circuit illustrated in FIG. 3A, in the period T31, there is an input of the pulse of the signal PRST.

In that case, the photoelectric transducer 151a is forward-biased. Further, the transistor 153a switches to the off state. At that time, the voltage of the gate of the transistor 152a is reset to a predetermined value.

Then, in the period T32 following the input of the pulse of the signal PRST, the photoelectric transducer 151a is reverse-biased. Further, the transistor 153a remains off.

At this time, photocurrent flows between the first and second current terminals of the photoelectric transducer 151a in accordance with the illuminance of light incident on the photoelectric transducer 151a. Further, the voltage value of the gate of the transistor 152a is changed in accordance with the photocurrent. In that case, channel resistance between the source and the drain of the transistor 152a is changed in accordance with the value of the voltage of the gate of the transistor 152a.

Then, in the period T33, there is an input of the pulse of the signal OSEL so that the transistor 153a is in the on state.

At this time, the photoelectric transducer 151a remains reverse-biased and current flows through the source and the drain of the transistor 152a and the source and the drain of the transistor 153a. The amount of the current flowing through the source and the drain of the transistor 152a and the source and the drain of the transistor 153a depends on the value of the voltage of the gate of the transistor 152a. Thus, optical data has a value based on the illuminance of light incident on the photoelectric transducer 151a. In addition, the photodetection circuit illustrated in FIG. 3A outputs optical data from the rest of the other of the source and the drain of the transistor 152a or the other of the source and the drain of the transistor 153a as an optical data signal. This is the example of the method for driving the photodetection circuit illustrated in FIG. 3A.

Next, the example of the method for driving the photodetection circuit illustrated in FIG. 3B will be described with reference to FIG. 3E. FIG. 3E is a timing diagram for describing the example of the method for driving the photodetection circuit illustrated in FIG. 3B.

In the example of the method for driving the photodetection circuit illustrated in FIG. 3B, first, in the period T41, there is an input of the pulse of the signal PRST so that the transistor 155 is in the on state. In addition, in the period T41 and the period T42, there is an input of the pulse of the signal TX so that the transistor 154 is in the on state. Note that in the period T41, the timing of starting the input of the pulse of the signal PRST may be earlier than timing of starting the input of the signal TX.

At this time, in the period T41, the photoelectric transducer 151b is forward-biased, so that the voltage of the gate of the transistor 152b is reset to a value equivalent to the voltage Va.

In addition, after the input of the pulse of the signal PRST ends, the transistor 155 switches to the off state.

Further, in the period T42, the photoelectric transducer 151b is reverse-biased, the transistor 154 remains on, and the transistor 155 switches to the off state.

At this time, photocurrent flows between the first and second current terminals of the photoelectric transducer 151b in accordance with the illuminance of light incident on the photoelectric transducer 151b. Further, the voltage value of the gate of the transistor 152b is changed in accordance with the photocurrent. In this case, channel resistance between the source and the drain of the transistor 152b is changed.

In addition, after the input of the signal TX ends, the transistor 154 switches to the off state.

Next, in the period T43, the transistor 154 switches to the off state.

At this time, the voltage of the gate of the transistor 152b is kept being a value determined in accordance with the photocurrent of the photoelectric transducer 151b in the period T42. Although the period T43 is not necessarily provided, providing the period T43 allows a timing of outputting a data signal in the photodetection circuit to be set as appropriate. For example, a timing of outputting a data signal in each of the plurality of photodetection circuits can be set as appropriate.

Further, in the period T44, there is an input of the pulse of the signal OSEL so that the transistor 153b is in the on state.

At this time, the photoelectric transducer 151b remains reverse-biased and the transistor 153b switches to the on state.

Further at this time, current flows through the source and the drain of the transistor 152b and the source and the drain of the transistor 153b, and the photodetection circuit illustrated in FIG. 3B outputs optical data as a data signal from the rest of the other of the source and the drain of the transistor 152b or the other of the source and the drain of the transistor 153b. This is the example of the method for driving the photodetection circuit illustrated in FIG. 3B.

Figure 3F:
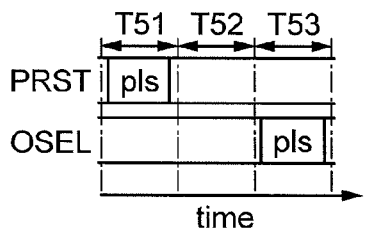

Next, the example of the driving method of the photodetection circuit in FIG. 3C will be described with reference to FIG. 3F. FIG. 3F is a timing diagram for describing the example of the method for driving the photodetection circuit illustrated in FIG. 3C.

In the example of the method for driving the photodetection circuit illustrated in FIG. 3C, in the period T51, there is an input of the pulse of the signal PRST.

At that time, the photoelectric transducer 151c is forward-biased and the voltage of the gate of the transistor 152c is reset to a predetermined value.

Then, in the period T52 following the input of the pulse of the signal PRST, the photoelectric transducer 151c is reverse-biased.

At this time, photocurrent flows between the first and second current terminals of the photoelectric transducer 151c in accordance with the illuminance of light incident on the photoelectric transducer 151c. Further, the voltage of the gate of the transistor 152c is changed in accordance with the photocurrent.

Then, in the period T53, there is an input of the pulse of the signal OSEL.

At that time, the photoelectric transducer 151c remains reverse-biased, a current flows between the source and the drain of the transistor 152c, and the photodetection circuit in FIG. 3C outputs optical data as a data signal from the other of the source and the drain of the transistor 152c. This is the example of the method for driving the photodetection circuit illustrated in FIG. 3C.

As described with reference to FIGS. 3A to 3F, the example of the photodetection circuit of this embodiment includes the photoelectric transducer and the amplifier transistor. In the example of the photodetection circuit of this embodiment, optical data is generated in accordance with the intensity of incident light and is output as a data signal in accordance with an output selection signal.

With such a structure, the photodetection circuit can generate and output optical data.

Embodiment 4

In this embodiment, structural examples of the input/output device of the above embodiment are described.

The input/output device of this embodiment includes a first substrate (also called an active matrix substrate) provided with a semiconductor element such as a transistor, and a second substrate (also called a counter substrate).

Figure 4A:
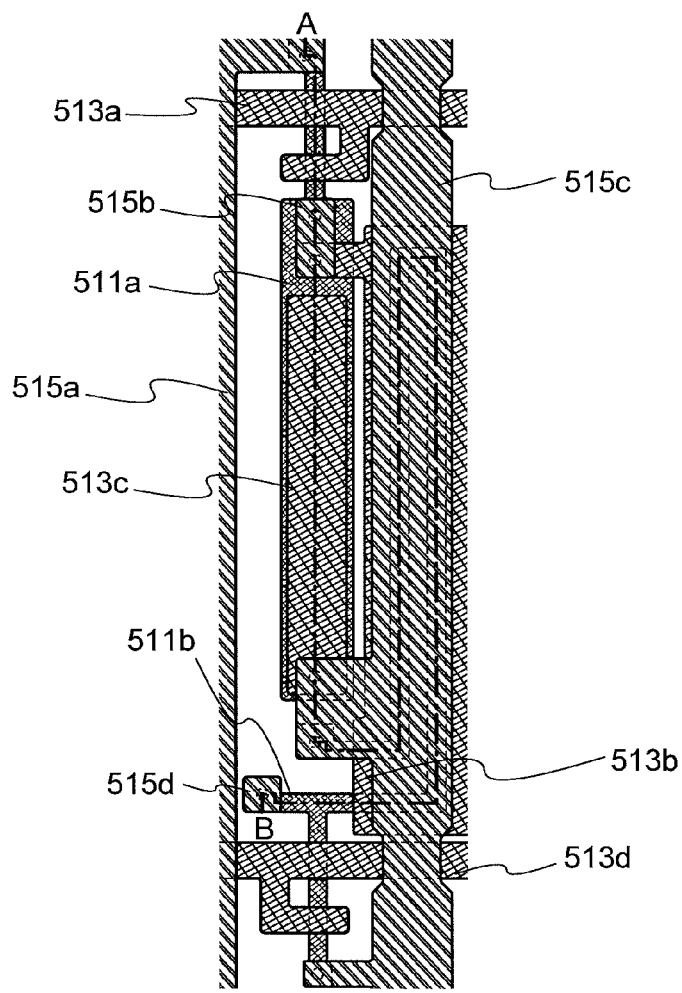
FIGS. 4A and 4B are diagrams illustrating a structural example of an active-matrix substrate in the input/output device in Embodiment 4.
Figure 4B:
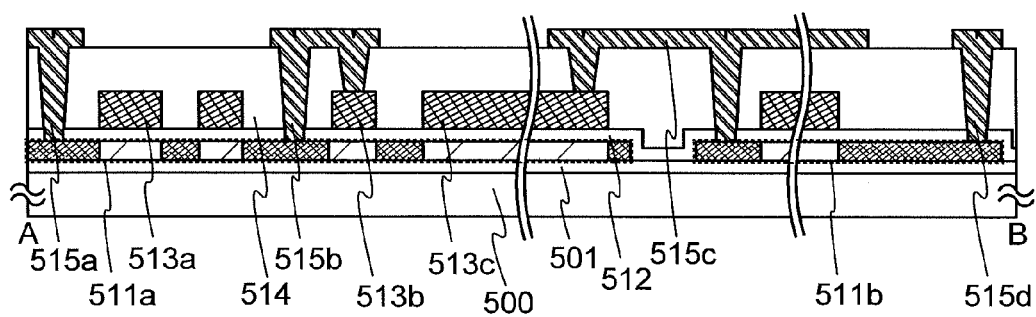
Figure 5A:
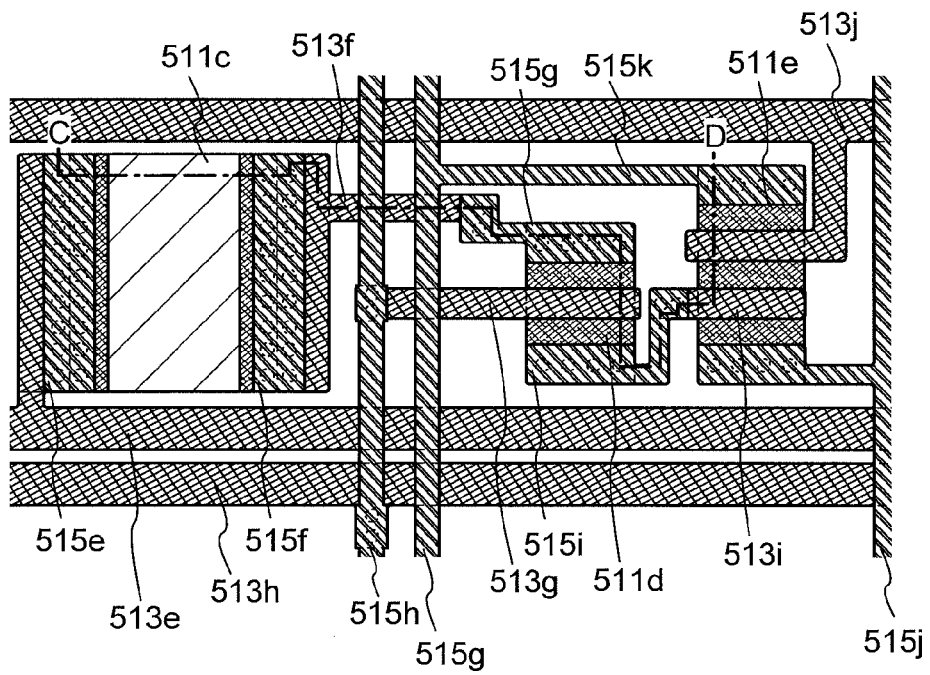
FIGS. 5A and 5B are diagrams illustrating a structural example of the active-matrix substrate in the input/output device in Embodiment 4.
Figure 5B:
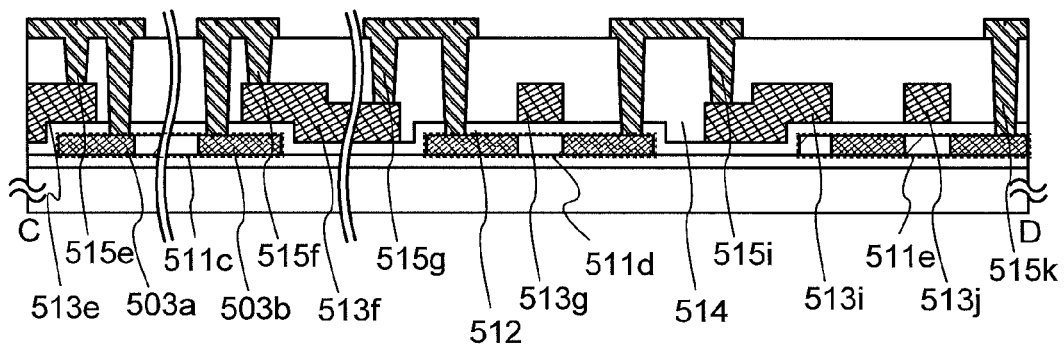

First, structural examples of the active matrix substrate in the input/output device of this embodiment will be described with reference to FIGS. 4A and 4B and FIGS. 5A and 5B. FIGS. 4A and 4B and FIGS. 5A and 5B illustrate structural examples of the active matrix substrate in the input/output device of this embodiment. FIG. 4A is a schematic plan view, and FIG. 4B is a schematic cross-sectional view taken along line A-B in FIG. 4A. FIG. 5A is a schematic plan view, and FIG. 5B is a schematic cross-sectional view taken along line C-D in FIG. 305A. Note that FIGS. 5A and 5B illustrate a photodetection circuit having the structure shown in FIG. 3A to which a charge storage control transistor is added, as an example of a photodetection circuit. Note that the components illustrated in FIGS. 4A and 4B and FIGS. 5A and 5B include those in sizes different from the actual sizes. For convenience, section A-B illustrated in FIG. 4A is partly omitted in FIG. 4B and section C-D shown in FIG. 5A is partly omitted in FIG. 5B The active-matrix substrate illustrated in FIGS. 4A and 4B and FIGS. 5A and 5B includes a substrate 500, an insulating layer 501, semiconductor layers 511a to 511e, an insulating layer 512, conductive layers 513a to 513j, an insulating layer 514, and conductive layers 515a to 515k.

Each of the semiconductor layers 511a to 511e is provided over one plane of the substrate 500 with the insulating layer 501 interposed therebetween.

The semiconductor layer 511a includes a plurality of impurity regions each containing an impurity element imparting p-type or n-type conductivity. The semiconductor layer 511a serves as a layer in which the channel of a signal-input-selection transistor in the light emission circuit is formed (also called a channel formation layer) and as the second capacitor electrode of the storage capacitor in the light emission circuit.

The semiconductor layer 511b includes a plurality of impurity regions each containing an impurity element imparting p-type or n-type conductivity. The semiconductor layer 511b serves as the channel formation layer of the drive transistor in the light emission circuit and as the channel formation layer of a luminance switch selection transistor in the light emission circuit.

The semiconductor layer 511c includes an impurity region 503a containing an impurity element imparting one of p-type conductivity and n-type conductivity, an impurity region 503b containing an impurity element imparting the other of p-type conductivity and n-type conductivity, and a semiconductor region between the impurity region 503a and the impurity region 503b. Note that in the semiconductor layer 511c, the semiconductor region may contain an impurity element imparting p-type or n-type conductivity the concentration of which is lower than that of the impurity element in the impurity region 503a or 503b. The semiconductor layer 511c serves as the photoelectric transducer in the photodetection circuit. Note that one embodiment of the present invention is not limited to the use of a semiconductor layer containing a p-type impurity region and an n-type impurity region; the photoelectric transducer can be formed by a stack of a p-type semiconductor layer and an n-type semiconductor layer.

The semiconductor layer 511d includes a plurality of impurity regions each containing an impurity element imparting p-type or n-type conductivity. The semiconductor layer 511d serves as the channel formation layer of the charge storage control transistor in the photodetection circuit.

The semiconductor layer 511e includes a plurality of impurity regions each containing an impurity element imparting p-type or n-type conductivity. The semiconductor layer 511e serves as the channel formation layer of the amplifier transistor in the photodetection circuit and the channel formation layer of the output selection transistor in the photodetection circuit.

Note that a plurality of semiconductor regions that is a substitute for the semiconductor layers 511a to 511e may be provided by using one semiconductor layer as a semiconductor substrate and providing the semiconductor substrate with semiconductor regions electrically isolated from each other. In this case, the semiconductor substrate can be, for example, a single crystal semiconductor substrate, e.g., a single crystal silicon substrate.

The insulating layer 512 is provided over the semiconductor layers 511a to 511e. The insulating layer 512 serves as gate insulating layers of the signal-input-selection transistor, the drive transistor, and the luminance switch selection transistor which are in the light emission circuit; a dielectric layer of the storage capacitor in the light emission circuit; and gate insulating layers of the charge storage control transistor, the amplifier transistor, and the output selection transistor which are in the photodetection circuit.

The conductive layer 513a overlaps with part of the semiconductor layer 511a with the insulating layer 512 interposed therebetween. Note that a region of the semiconductor layer 511a which overlaps with the conductive layer 513a is the channel formation region of the signal-input-selection transistor in the light emission circuit. The conductive layer 513a serves as the gate of the signal-input-selection transistor in the light emission circuit. Note that in FIGS. 4A and 4B, the conductive layer 513a overlaps with part of the semiconductor layer 511a at a plurality of portions. The conductive layer 513a does not necessarily overlap with part of the semiconductor layer 511a at a plurality of portions, but the switching characteristics of the signal-input-selection transistor in the light emission circuit can be improved when the conductive layer 513a overlaps with part of the semiconductor layer 511a at a plurality of portions. Note that a region of the semiconductor layer 511a which overlaps with the conductive layer 513a may contain an impurity element imparting p-type or n-type conductivity the concentration of which is lower than that of the impurity element in the impurity region provided in the semiconductor layer 511a.

The conductive layer 513b overlaps with part of the semiconductor layers 511a and 511b with the insulating layer 512 interposed therebetween. Note that a region of the semiconductor layer 511a which overlaps with the conductive layer 513b is the channel formation region of the drive transistor in the light emission circuit. The conductive layer 513b serves as the gate of the drive transistor in the light emission circuit. Note that regions of the semiconductor layers 511a and 511b which overlap with the conductive layer 513b may each contain an impurity element imparting p-type or n-type conductivity the concentration of which is lower than that of the impurity element in the impurity region provided in the semiconductor layers 511a and 511b.

The conductive layer 513c overlaps with part of the semiconductor layer 511a with the insulating layer 512 interposed therebetween. The conductive layer 513c serves as the first capacitor electrode of the storage capacitor in the light emission circuit. Note that a region of the semiconductor layer 511a which overlaps with the conductive layer 513c may contain an impurity element imparting p-type or n-type conductivity the concentration of which is lower than that of an impurity in the impurity region provided in the semiconductor layer 511a.

Note that the above-described impurity regions is provided in a region of the semiconductor layer 511a which does not overlap with the conductive layers 513a to 513c.

The conductive layer 513d overlaps with part of the semiconductor layer 511b with the insulating layer 512 interposed therebetween. Note that a region of the semiconductor layer 511b which overlaps with the conductive layer 513d is the channel formation region of the luminance switch selection transistor in the light emission circuit. The conductive layer 513d serves as the gate of the luminance switch selection transistor in the light emission circuit. Note that in FIGS. 4A and 4B, the conductive layer 513d overlaps with part of the semiconductor layer 511b at a plurality of portions. The conductive layer 513d does not necessarily overlap with part of the semiconductor layer 511b at a plurality of portions, but the switching characteristics of the luminance switch selection transistor in the light emission circuit can be improved when the conductive layer 513d overlaps with part of the semiconductor layer 511b at a plurality of portions. Note that a region of the semiconductor layer 511b which overlaps with the conductive layer 513d may contain an impurity element imparting p-type or n-type conductivity the concentration of which is lower than that of an impurity in the impurity region provided in the semiconductor layer 511b.

Note that an impurity region is provided in a region of the semiconductor layer 511*b* which does not overlap with the conductive layers 513*b* and 513*d*.

The conductive layer 513*e* is provided over the insulating layer 512. The conductive layer 513*e* serves as the first current terminal of the photoelectric transducer in the photodetection circuit.

The conductive layer 513*f* is provided over the insulating layer 512. The conductive layer 513*f* serves as the second current terminal of the photoelectric transducer in the photodetection circuit.

The conductive layer 513*g* overlaps with part of the semiconductor layer 511*d* with the insulating layer 512 interposed therebetween. Note that a region of the semiconductor layer 511*d* which overlaps with the conductive layer 513*g* is the channel formation region of the charge storage control transistor in the photodetection circuit. The conductive layer 513*g* serves as the gate of the charge storage control transistor in the photodetection circuit.

Note that the above-described impurity region is provided in a region of the semiconductor layer 511*d* which does not overlap with the conductive layer 513*g*.

The conductive layer 513*h* is provided over the insulating layer 512. The conductive layer 513*h* serves as wiring for supplying a signal to the charge storage control transistor in the photodetection circuit.

The conductive layer 513*i* overlaps with part of the semiconductor layer 511*e* with the insulating layer 512 interposed therebetween. Note that a region of the semiconductor layer 511*e* which overlaps with the conductive layer 513*i* is the channel formation region of the amplifier transistor in the photodetection circuit. The conductive layer 513*i* serves as the gate of the amplifier transistor in the photodetection circuit.

The conductive layer 513*j* overlaps with part of the semiconductor layer 511*e* with the insulating layer 512 interposed therebetween. Note that a region of the semiconductor layer 511*e* which overlaps with the conductive layer 513*j* is the channel formation region of the output selection transistor in the photodetection circuit. The conductive layer 513*j* serves as the gate of the output selection transistor in the photodetection circuit.

Note that the above-described impurity region is provided in a region of the semiconductor layer 511*e* which does not overlap with the conductive layers 513*i* and 513*j*.

The insulating layer 514 is provided over the insulating layer 512 with the conductive layers 513*a* to 513*j* interposed therebetween.

The conductive layer 515*a* is electrically connected to one of the plurality of impurity regions of the semiconductor layer 511*a* through an opening in the insulating layers 512 and 514. The conductive layer 515*a* serves as wiring to which one of the source and the drain of the signal-input-selection transistor in the light emission circuit and wiring to which a display data signal is input.

The conductive layer 515*b* is electrically connected to one of the plurality of impurity regions of the semiconductor layer 511*a* through an opening in the insulating layers 512 and 514 and to the conductive layer 513*b* through an opening in the insulating layer 514. The conductive layer 515*b* serves as the other of the source and the drain of the signal-input-selection transistor in the light emission circuit.

Note that in the semiconductor layer 511*a*, the channel formation region of the signal-input-selection transistor in the light emission circuit is present between the impurity region electrically connected to the conductive layer 515*a* and the impurity region electrically connected to the conductive layer 515*b*.

The conductive layer 515*c* is electrically connected to the conductive layer 513*c* through an opening in the insulating layer 514, to one of the plurality of impurity regions of the semiconductor layer 511*b* (also called a first impurity region) through an opening in the insulating layers 512 and 514, and to an impurity region of the semiconductor layer 511*b* which is different from the first impurity region (also called a second impurity region) through another opening in the insulating layers 512 and 514. The conductive layer 515*c* serves as one of the source and the drain of the drive transistor in the light emission circuit, one of the source and the drain of the luminance switch selection transistor in the light emission circuit, and a power supply line to which the voltage Vb is input.

Note that, in FIG. 4A, the conductive layer 515*c* overlaps with the conductive layers 513*a* and 513*d*, and portions of the conductive layer 515*c* which overlap with the conductive layers 513*a* and 513*d* each have a width smaller than that of a portion of the conductive layer 515*c* which overlaps with the conductive layer 513*b*. The portions of the conductive layer 515*c* which overlap with the conductive layers 513*a* and 513*d* each do not necessarily have a width smaller than that of a portion of the conductive layer 515*c* which overlaps with the conductive layer 513*b*, but parasitic capacitance between the conductive layer 515*c* and each of the conductive layers 513*a* and 513*d* can be reduced by making the widths of the portions of the conductive layer 515*c* which overlap with the conductive layers 513*a* and 513*d* smaller than that of a portion of the conductive layer 515*c* which overlaps with the conductive layer 513*b*.

The conductive layer 515*d* is electrically connected to one of the plurality of impurity regions of the semiconductor layer 511*b* through an opening in the insulating layers 512 and 514. The conductive layer 515*d* serves as the other of the source and the drain of the drive transistor in the light emission circuit and the other of the source and the drain of the luminance switch selection transistor in the light emission circuit.

Note that in the semiconductor layer 511*b*, the channel formation region of the drive transistor in the light emission circuit is present between the first impurity region electrically connected to the conductive layer 515*c* and the impurity region electrically connected to the conductive layer 515*d*.

Further, in the semiconductor layer 511*b*, the channel formation region of the luminance switch selection transistor in the light emission circuit is present between the second impurity region electrically connected to the conductive layer 515*c* and the impurity region electrically connected to the conductive layer 515*d*.

The conductive layer 515*e* is electrically connected to the impurity region 503*a* in the semiconductor layer 511*c* through an opening in the insulating layers 512 and 514 and to the conductive layer 513*e* through an opening in the insulating layer 514. The conductive layer 515*e* serves as the first current terminal of the photoelectric transducer in the photodetection circuit.

The conductive layer 515*f* is electrically connected to the impurity region 503*b* in the semiconductor layer 511*c* through an opening in the insulating layers 512 and 514 and to the conductive layer 513*f* through an opening in the insulating layer 514. The conductive layer 515*f* serves as the second current terminal of the photoelectric transducer in the photodetection circuit.

The conductive layer 515*g* is electrically connected to the conductive layer 513*f* through an opening in the insulating layer 514 and to one of the plurality of impurity regions of the semiconductor layer 511d through an opening in the insulating layers 512 and 514. The conductive layer 515g serves as one of the source and the drain of the charge storage control transistor in the photodetection circuit.

The conductive layer 515h is electrically connected to the conductive layer 513g through an opening in the insulating layer 514 and to the conductive layer 513h through another opening in the insulating layer 514. The conductive layer 515h serves as wiring for supplying a charge storage control signal.

The conductive layer 515i is electrically connected to one of the plurality of impurity regions of the semiconductor layer 511d through an opening in the insulating layers 512 and 514 and to the conductive layer 513i through an opening in the insulating layer 514. The conductive layer 515i serves as the other of the source and the drain of the charge storage control transistor in the photodetection circuit.

Note that, in the semiconductor layer 511d, the channel formation region of the charge storage control transistor in the photodetection circuit is present between the impurity region electrically connected to the conductive layer 515g and the impurity region electrically connected to the conductive layer 515i.

The conductive layer 515j is electrically connected to one of the plurality of impurity regions of the semiconductor layer 511e through an opening in the insulating layers 512 and 514. The conductive layer 515j serves as the other of the source and the drain of the amplifier transistor in the photodetection circuit.

The conductive layer 515k is electrically connected to one of the plurality of impurity regions of the semiconductor layer 511e through an opening in the insulating layers 512 and 514. The conductive layer 515k serves as the other of the source and the drain of the output selection transistor in the photodetection circuit.

Note that, in the semiconductor layer 511e, the channel formation region of the amplifier transistor in the photodetection circuit and the channel formation region of the output selection transistor in the photodetection circuit are present between the impurity region electrically connected to the conductive layer 515j and the impurity region electrically connected to the conductive layer 515k.

Figure 6A:
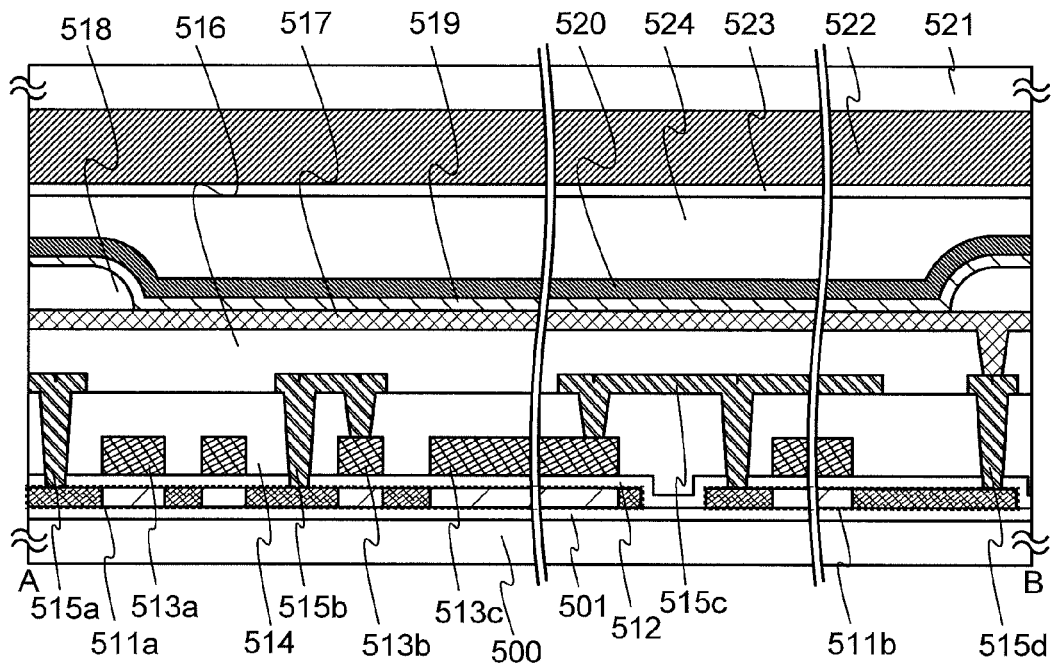
FIGS. 6A and 6B are diagrams illustrating a structural example of the input/output device in Embodiment 4.
Figure 6B:
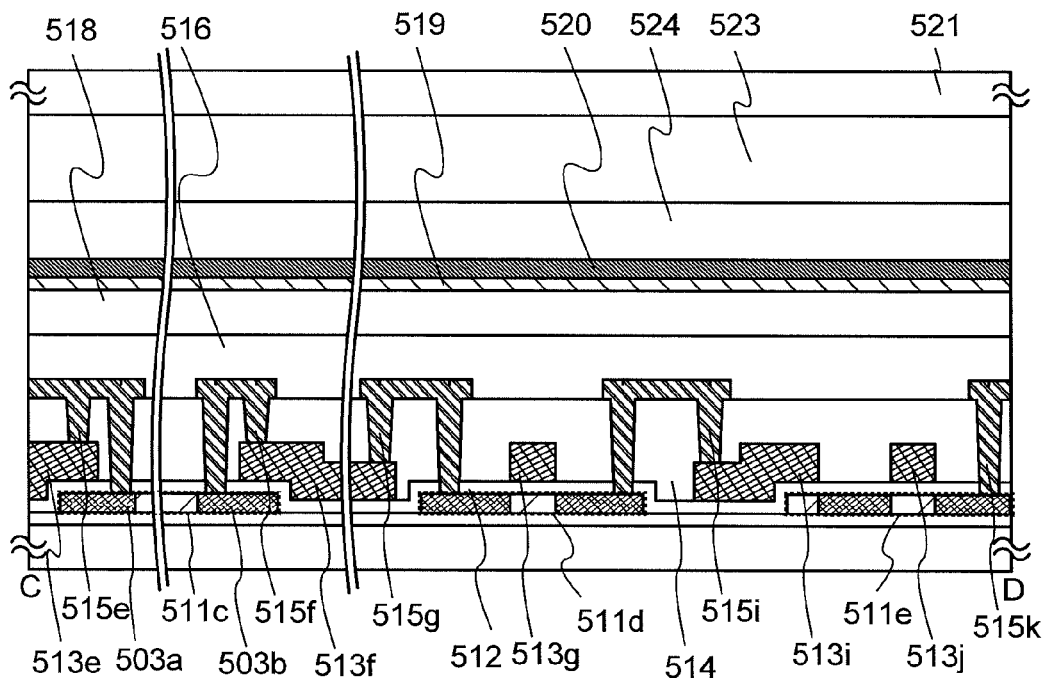

A structural example of the input/output device in this embodiment will be described with reference to FIGS. 6A and 6B. FIGS. 6A and 6B are cross-sectional schematic views illustrating the structural example of the input/output device in this embodiment.

The input/output device illustrated in FIGS. 6A and 6B includes, in addition to the active-matrix substrate illustrated in FIGS. 4A and 4B and FIGS. 5A and 5B, an insulating layer 516, a conductive layer 517, an insulating layer 518, an electroluminescent layer 519, a conductive layer 520, a substrate 521, a coloring layer 522, an insulating layer 523, and an insulating layer 524.

The insulating layer 516 is provided over the insulating layer 514 with the conductive layers 515a to 515k interposed therebetween.

The conductive layer 517 is provided over the insulating layer 516 in the light emission circuit and electrically connected to the conductive layer 515d through an opening in the insulating layer 516. The conductive layer 517 serves as the first current terminal of the light emitting element in the light emission circuit.

The insulating layer 518 is provided over the conductive layer 517.

The electroluminescent layer 519 is provided over the insulating layer 518 and electrically connected to the conductive layer 517 through an opening in the insulating layer 518. The electroluminescent layer 519 serves as the electroluminescent layer of the light emitting element in the light emission circuit.

The conductive layer 520 is provided over the electroluminescent layer 519 and electrically connected to the electroluminescent layer 519. The conductive layer 520 serves as the second current terminal of the light emitting element in the light emission circuit.

Note that in an example of the input/output device in this embodiment, the light emitting element is configured to emit light toward the top side, but one embodiment of the present invention is not limited to this; the light emitting element can be configured to emit light toward the bottom side or both the top and bottom sides.

The coloring layer 522 is provided over one plane of the substrate 521 so as to transmit light from the electroluminescent layer 519. Note that another coloring layer may be provided in the region where the photodetection circuit is formed.

The insulating layer 523 is provided over one plane of the substrate 521 with the coloring layer 522 interposed therebetween.

The insulating layer 524 is provided between the insulating layer 523 and the conductive layer 520.

The components of the input/output device described with reference to FIGS. 4A and 4B, FIGS. 5A and 5B, and FIGS. 6A and 6B will be described.

A glass substrate or a plastic substrate, for example, can be used as each of the substrates 500 and 521. Note that the substrates 500 and 521 are not necessarily provided.

As the insulating layer 501, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, or a hafnium oxide layer can be used, for example. For example, a silicon oxide layer, a silicon oxynitride layer, or the like can be used as the insulating layer 501. The above-described oxide insulating layer may contain halogen. The insulating layer 501 can be a stack of layers of a material that can be used for the insulating layer 501. The insulating layer 501 is not necessarily provided.

As each of the semiconductor layers 511a to 511e, a layer containing an amorphous semiconductor, a microcrystalline semiconductor, a polycrystalline semiconductor, or a single crystal semiconductor, for example, can be used. As each of the semiconductor layers 511a to 511e, a semiconductor layer containing a semiconductor that belongs to Group 14 in the periodic table (e.g., silicon), for example, can be used.

The insulating layer 512 can be a layer of a material that can be used for the insulating layer 501. The insulating layer 512 can be a stack of layers of a material that can be used for the insulating layer 512.

Each of the conductive layers 513a to 513j can be, for example, a layer of a metal material such as molybdenum, titanium, chromium, tantalum, tungsten, aluminum, copper, neodymium, or scandium. Alternatively, each of the conductive layers 513a to 513j can be a layer containing a conductive metal oxide. The conductive metal oxide can be a metal oxide such as indium oxide ($In_2O_3$), tin oxide ($SnO_2$), zinc oxide (ZnO), an alloy of indium oxide and tin oxide ($In_2O_3$—$SnO_2$, which is abbreviated to ITO in some cases), or an alloy of indium oxide and zinc oxide ($In_2O_3$—ZnO); or the metal oxide containing silicon, silicon oxide, or nitrogen, for example. Each of the conductive layers 513a to 513j can be a stack of a tantalum nitride layer and a tungsten layer, for example. Note that side surfaces of each of the conductive layers 513a to 513j may be tapered.

Each of the conductive layers 513a to 513j can be a stack of layers of a material that can be used for the conductive layers 513a to 513j.

The insulating layer 514 can be a layer of a material that can be used for the insulating layer 501. The insulating layer 514 can be a stack of layers of a material that can be used for the insulating layer 501. For example, the insulating layer 514 can be a stack of a silicon nitride oxide layer and a silicon oxynitride layer.

Each of the conductive layers 515a to 515k can be a layer of a material that can be used for the conductive layers 513a to 513j. Each of the conductive layers 515a to 515k can be a stack of layers of a material that can be used for the conductive layers 515a to 515k. For example, each of the conductive layers 515a to 515k can be a stack of a titanium layer, an aluminum layer, and a titanium layer. Note that side surfaces of each of the conductive layers 515a to 515k may be tapered.

The insulating layer 516 can be a layer of a material that can be used for the insulating layer 512. The insulating layer 516 can be a stack of layers of a material that can be used for the insulating layer 516.

The conductive layer 517 can be a layer of a light reflective material that can be used for the conductive layers 513a to 513j. Alternatively, the conductive layer 517 can be a stack of layers of a material that can be used for the conductive layer 517. Note that one embodiment of the present invention is not limited to this; when the light emitting element in the input/output device in this embodiment is configured to emit light toward the bottom side or both the top and bottom sides, the conductive layer 517 can be a layer of a light-transmitting material that can be used for the conductive layers 513a to 513j. Note that side surfaces of the conductive layer 517 may be tapered.

The insulating layer 518 can be an organic insulating layer or inorganic insulating layer, for example. Note that the insulating layer 518 is also called a partition.

The electroluminescent layer 519 is a layer emitting light of a single particular color. The electroluminescent layer 519 can be a light-emitting layer using a light-emitting material emitting light of a particular color, for example. Note that the electroluminescent layer 519 can be formed by a stack of light-emitting layers emitting light of different colors. The light-emitting material can be an electroluminescent material such as a fluorescent material or a phosphorescent material. Alternatively, the light-emitting material can be formed by a material containing a plurality of electroluminescent materials. A light-emitting layer emitting white light may be formed by a stack of a layer of a fluorescent material emitting blue light, a layer of a first phosphorescent material emitting orange color, and a layer of a second phosphorescent material emitting orange color, for example. Alternatively, the electroluminescent material can be an organic electroluminescent material or an inorganic electroluminescent material. Alternatively, the electroluminescent layer may be formed, for example, by, in addition to the above-described light-emitting layer, one or more of the following layers: a hole-injection layer, a hole-transport layer, an electron-transport layer, and an electron-injection layer.

The conductive layer 520 can be a layer of a light-transmitting material that can be used for the conductive layers 513a to 513j. Alternatively, the conductive layer 520 can be a stack of layers of a material that can be used for the conductive layer 520. Note that one embodiment of the present invention is not limited to this; when the light emitting element in the input/output device in this embodiment is configured to emit light toward the bottom side, the conductive layer 520 can be a layer of a light-reflective material that can be used for the conductive layers 513a to 513j. Note that side surfaces of the conductive layer 520 may be tapered.

The coloring layer 522 can be a layer transmitting red light, green light, or blue light and containing dyes or pigments, for example. Alternatively, the coloring layer 522 can be a layer transmitting cyan light, magenta light, or yellow light and containing dyes or pigments. When containing dyes, the coloring layer 522 is formed by the photolithography method, the printing method, or the inkjet method, for example. When containing pigments, the coloring layer 522 is formed by the photolithography method, the printing method, the electrodeposition method, the electro-photographic method, or the like. By using the inkjet method, for example, the coloring layer can be manufactured at room temperature, manufactured at a low vacuum, or formed over a large substrate. Since the coloring layer can be manufactured without a resist mask, manufacturing cost and the number of steps can be reduced.

The insulating layer 523 can be a layer of a material that can be used for the insulating layer 501. The insulating layer 523 can be a stack of layers of a material that can be used for the insulating layer 523. Note that the insulating layer 523 is not necessarily provided, but providing the insulating layer 523 can reduce the entry of an impurity from the coloring layer 522 to the light emitting element.

The insulating layer 524 can be a layer of a material that can be used for the insulating layer 501 or a layer of a resin material. The insulating layer 524 can be a stack of layers of a material that can be used for the insulating layer 524.

As described with reference to FIGS. 4A and 4B, FIGS. 5A and 5B, and FIGS. 6A and 6B, an example of the input/output device in this embodiment includes the active-matrix substrate provided with the transistors, the light emitting elements, and the photoelectric transducers, and the counter substrate.

With such a structure, the light emission circuit and the photodetection circuit can be formed over one substrate in the same process, thereby reducing manufacturing cost.

An example of the input/output device in this embodiment includes a light emitting element emitting light of a single particular color, and a coloring layer which is provided to the counter substrate and transmits light with a particular wavelength emitted from the light emitting element. Note that one embodiment of the present invention is not limited to the above structure; a plurality of light emitting elements emitting light of different colors may be formed. Alternatively, part of the counter substrate may be provided with a light-blocking layer to reduce the entry of unnecessary light to the element provided to the active-matrix substrate.

This structure enables a full-color image to be displayed without forming a plurality of light emitting elements emitting light of different colors, thereby facilitating the manufacturing process, enhancing yield and improving the quality and reliability of the light emitting elements.

In addition, in the input/output device of this embodiment, a circuit such as the light emission driver circuit and the photodetection driver circuit can be provided over the same substrate as the light emission circuit and the photodetection circuit. In this case, the transistor in a circuit such as the light emission driver circuit and the photodetection driver circuit can have the same structure as the transistor in the light emission circuit and the photodetection circuit. By providing a circuit such as the light emission driver circuit and the photodetection driver circuit over the same substrate as the light emission circuit and the photodetection circuit, the number of connecting wirings between the light emission circuit and the light emission driver circuit or between the photodetection circuit and the photodetection driver circuit can be reduced.

Embodiment 5

In this embodiment, described are examples of an electronic appliance each provided with the input/output device of the above embodiments.

Structural examples of the electronic devices of this embodiment will be described with reference to FIGS. 7A to 7D. FIGS. 7A to 7D are schematic views each illustrating a structural example of the electronic appliance of this embodiment.

Figure 7A:
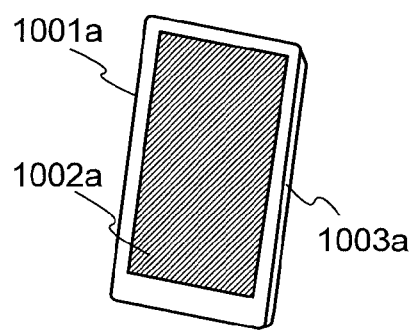
FIGS. 7A to 7D are schematic diagrams illustrating examples of electronic devices in Embodiment 5.

An electronic appliance in FIG. 7A is an example of a mobile information terminal. The mobile information terminal in FIG. 7A includes a housing $1001a$ and an input/output unit $1002a$ provided in the housing $1001a$.

Note that a side surface $1003a$ of the housing $1001a$ may be provided with a connection terminal for connecting the mobile information terminal to an external device and one or more buttons used to operate the mobile information terminal in FIG. 7A.

The mobile information terminal in FIG. 7A includes a CPU, a main memory, an interface transmitting/receiving a signal traveling between the external device and each of the CPU and the main memory, and an antenna transmitting/receiving a signal to/from the external device, in the housing $1001a$. Note that one or more integrated circuits having a particular function may be provided in the housing $1001a$.

The mobile information terminal in FIG. 7A serves, for example, as one or more devices selected from a telephone, an electronic book, a personal computer, and a game machine.

Figure 7C:
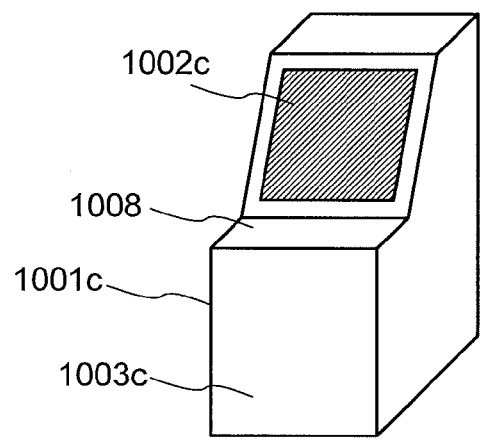
Figure 7B:
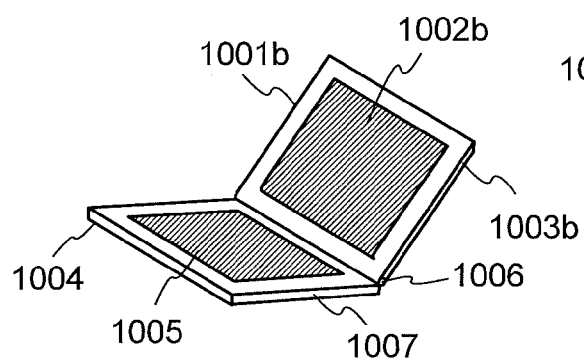

An electronic appliance in FIG. 7B is an example of a folding mobile information terminal. The mobile information terminal in FIG. 7B includes a housing $1001b$, an input/output unit $1002b$ provided in the housing $1001b$, a housing $1004$, an input/output unit $1005$ provided in the housing $1004$, and a hinge $1006$ for connecting the housing $1001b$ and the housing $1004$.

In the mobile information terminal in FIG. 7B, the housing $1001b$ can be stacked on the housing $1004$ by moving the housing $1001b$ or the housing $1004$ with the hinge $1006$.

Note that a side surface $1003b$ of the housing $1001b$ or a side surface $1007$ of the housing $1004$ may be provided with a connection terminal for connecting the mobile information terminal to an external device and one or more buttons used to operate the mobile information terminal in FIG. 7B.

The input/output unit $1002b$ and the input/output unit $1005$ may display different images or continuous images. Note that the input/output unit $1005$ is not necessarily provided; a keyboard which is an input device may be provided instead of the input/output unit $1005$.

The mobile information terminal in FIG. 7B includes a CPU, a main memory, and an interface transmitting/receiving a signal traveling between the external device and each of the CPU and the main memory, in the housing $1001b$ or the housing $1004$. One or more integrated circuits having a particular function may be provided in the housing $1001b$ or $1004$. In addition, the mobile information terminal in FIG. 7B may include an antenna transmitting/receiving a signal to/from the external device.

The mobile information terminal in FIG. 7B serves, for example, as one or more devices selected from a telephone, an electronic book, a personal computer, and a game machine.

The electronic appliance in FIG. 7C is an example of a stationary information terminal. The stationary information terminal in FIG. 7C includes a housing $1001c$ and an input/output unit $1002c$ provided in the housing $1001c$.

Note that the input/output unit $1002c$ can be provided in a top board $1008$ of the housing $1001c$.

The stationary information terminal in FIG. 7C includes a CPU, a main memory, and an interface transmitting/receiving a signal traveling between the external device and each of the CPU and the main memory, in the housing $1001c$. Note that one or more integrated circuits having a particular function may be provided in the housing $1001c$. In addition, the stationary information terminal in FIG. 7C may include an antenna transmitting/receiving a signal to/from the external device.

Further, a side surface $1003c$ of the housing $1001c$ in the stationary information terminal in FIG. 7C may be provided with one or more parts selected from a ticket ejection portion that ejects a ticket or the like, a coin slot, and a bill slot.

The stationary information terminal in FIG. 7C serves, for examples, as an automated teller machine, an information communication terminal for ticketing or the like (also referred to as a multi-media station), or a game machine.

Figure 7D:
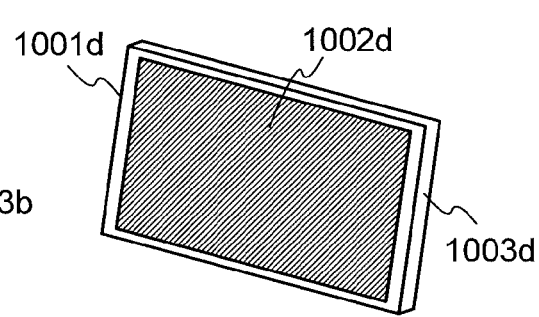

FIG. 7D shows an example of a stationary information terminal. The stationary information terminal in FIG. 7D includes a housing $1001d$ and an input/output unit $1002d$ provided in the housing $1001d$. Note that a support for supporting the housing $1001d$ may also be provided.

Note that a side surface $1003d$ of the housing $1001d$ may be provided with a connection terminal for connecting the mobile information terminal to an external device and one or more buttons used to operate the stationary information terminal in FIG. 7D.

The stationary information terminal in FIG. 7D may include a CPU, a main memory, and an interface transmitting/receiving a signal traveling between the external device and each of the CPU and the main memory, in the housing $1001d$. One or more integrated circuits having a particular function may be provided in the housing $1001d$. In addition, the stationary information terminal in FIG. 7D may include an antenna transmitting/receiving a signal to/from the external device.

The stationary information terminal in FIG. 7D serves, for example, as a digital photo frame, an input/output monitor, or a television device.

The input/output device of the above embodiments is used, for example, as an input/output unit of an electronic appliance. The input/output device of the above embodiments is used, for example, as each of the input/output units $1002a$ to $1002d$ in FIGS. 7A to 7D. In addition, the input/output device of the above embodiments may be used as the input/output unit $1005$ in FIG. 7B.

As described with reference to FIGS. 7A to 7D, examples of an electronic appliance of this embodiment each include an input/output unit for which the input/output device of the above embodiments is used. Consequently, it is possible to operate the electronic appliance or input data to the electronic appliance with a finger or a pen.

In addition, the housings of examples of electronic devices of this embodiment may be each provided with either a photoelectric transducer generating power source voltage in accordance with the intensity of incident light or an operating unit for operating the input/output device, or both. Providing a photoelectric transducer, for example, eliminates necessity of an external power source, allowing the above electronic appliance to be used for a long period of time even in a place without an external power source.

This application is based on Japanese Patent Application serial No. 2010-253618 filed with Japan Patent Office on Nov. 12, 2010, the entire contents of which are hereby incorporated by reference.

What is claimed is:

1. An input/output device comprising:
a pixel area including a first light emission circuit, a second light emission circuit, and a photodetection circuit, wherein the photodetection circuit is configured to generate a voltage having a value corresponding to an intensity of incident light,
each of the first light emission circuit and the second light emission circuit comprising:
a drive transistor comprising a source, a drain, and a gate; and
a light emitting element comprising a first current terminal and a second current terminal, wherein the first current terminal is electrically connected to the source or the drain of the drive transistor, wherein a first voltage is input to the second current terminal, and wherein the light emitting element emits light in accordance with a current flowing between the first current terminal and the second current terminal;
the second light emission circuit comprising:
a switching element comprising a first terminal and a second terminal, wherein a second voltage is input to the first terminal, wherein the second terminal is electrically connected to the first current terminal of the light emitting element, and wherein, when an object to be detected is over the pixel area, light emitted from the second light emission circuit is reflected by the object to be detected, and light reflected by the object to be detected enters the photodetection circuit.

2. The input/output device according to claim 1, wherein each of the first light emission circuit and the second light emission circuit comprises a coloring layer transmitting light of a particular color emitted from the light emitting element.

3. The input/output device according to claim 1, wherein the input/output device is incorporated in one of a mobile information terminal and a stationary information terminal.

4. A method for driving an input/output device comprising:
a pixel area including a first light emission circuit, a second light emission circuit, and a photodetection circuit, wherein the photodetection circuit is configured to generate a voltage having a value corresponding to an intensity of incident light,
each of the first light emission circuit and the second light emission circuit comprising:
a drive transistor comprising a source, a drain, and a gate;
a light emitting element comprising a first current terminal and a second current terminal, wherein the first current terminal is electrically connected to the source or the drain of the drive transistor, wherein a first voltage is input to the second current terminal, and wherein the light emitting element emits light in accordance with a current flowing between the first current terminal and the second current terminal; and
the second light emission circuit comprising:
a switching element comprising a first terminal and a second terminal, wherein a second voltage is input to the first terminal, wherein the second terminal is electrically connected to the first current terminal of the light emitting element;
the method for driving the input/output device comprising the steps of:
inputting a display data signal to each of the first light emission circuit and the second light emission circuit to set a voltage of the gate of the drive transistor to a value corresponding to a voltage of the display data signal;
switching the switching element in the second light emission circuit to an on state; and
generating an optical data which is a voltage having a value corresponding to an intensity of light entering the photodetection circuit when the switching element is in the on state.

5. A method for driving an input/output device comprising:
a pixel area including a first light emission circuit, a second light emission circuit, and a photodetection circuit, wherein the photodetection circuit is configured to generate a voltage having a value corresponding to an intensity of incident light,
each of the first light emission circuit and the second light emission circuit comprising:
a drive transistor comprising a source, a drain, and a gate;
a light emitting element comprising a first current terminal and a second current terminal, wherein the first current terminal is electrically connected to the source or the drain of the drive transistor, wherein a first voltage is input to the second current terminal, and wherein the light emitting element emits light in accordance with a current flowing between the first current terminal and the second current terminal; and
the second light emission circuit comprising:
a switching element comprising a first terminal and a second terminal, wherein a second voltage is input to the first terminal, wherein the second terminal is electrically connected to the first current terminal of the light emitting element;
the method for driving the input/output device comprising the steps of:
inputting a display data signal to each of the first light emission circuit and the second light emission circuit to set a voltage of the gate of the drive transistor to a value corresponding to a voltage of the display data signal;
switching the switching element in the second light emission circuit to an on state; and
generating a first optical data which is a voltage having a value corresponding to an intensity of light entering the photodetection circuit when the switching element is in the on state;
generating a second optical data which is a voltage having a value corresponding to an intensity of light entering the photodetection circuit when the switching element is in an off state; and
generating data of a difference between the first optical data and the second optical data.

* * * * *